United States Patent
Kurioka et al.

(10) Patent No.: US 8,320,102 B2
(45) Date of Patent: Nov. 27, 2012

(54) CAPACITOR, CAPACITOR DEVICE, ELECTRONIC COMPONENT, FILTER DEVICE, COMMUNICATION APPARATUS, AND METHOD OF MANUFACTURING CAPACITOR DEVICE

(75) Inventors: Hideharu Kurioka, Kyoto (JP); Hiroshi Katta, Kyoto (JP); Yoshihiro Okubo, Osaka (JP)

(73) Assignee: KYOCERA Corporation, Kyoto (JP)

( * ) Notice: Subject to any disclaimer, the term of this patent is extended or adjusted under 35 U.S.C. 154(b) by 759 days.

(21) Appl. No.: 12/441,892

(22) PCT Filed: Sep. 25, 2007

(86) PCT No.: PCT/JP2007/068588
§ 371 (c)(1),
(2), (4) Date: Mar. 18, 2009

(87) PCT Pub. No.: WO2008/041565
PCT Pub. Date: Apr. 10, 2008

(65) Prior Publication Data
US 2010/0020469 A1    Jan. 28, 2010

(30) Foreign Application Priority Data

Sep. 27, 2006 (JP) ................. 2006-262920
Nov. 29, 2006 (JP) ................. 2006-321805
Jan. 30, 2007 (JP) ................. 2007-019282

(51) Int. Cl.
*H01G 4/06* (2006.01)
(52) U.S. Cl. ...................... 361/311; 29/25.42
(58) Field of Classification Search .......... 361/303, 361/311, 328–330, 277
See application file for complete search history.

(56) References Cited

U.S. PATENT DOCUMENTS

| | | | |
|---|---|---|---|
| 2002/0163769 A1* | 11/2002 | Brown | 361/287 |
| 2007/0057599 A1* | 3/2007 | Motai et al. | 310/324 |

FOREIGN PATENT DOCUMENTS

| | | |
|---|---|---|
| JP | 54-150665 | 11/1979 |
| JP | S54-150665 A | 11/1979 |
| JP | 04-111461 | 4/1992 |
| JP | H04-111461 A | 4/1992 |
| JP | H04-209513 A | 7/1992 |
| JP | H06-011338 U | 2/1994 |
| JP | 08-340090 | 12/1996 |

(Continued)

OTHER PUBLICATIONS

Notice of Reasons for Rejection dated Jul. 29, 2011, issued for counterpart Japanese Patent Application No. 2008-537480.

(Continued)

*Primary Examiner* — Eric Thomas
(74) *Attorney, Agent, or Firm* — Procopio, Cory, Hargreaves & Savitch LLP

(57) ABSTRACT

The present invention relates to a small, low-height capacitor device in which deterioration of characteristics such as leakage current is reduced. The capacitor device includes a supporting substrate 1; at least one capacitor element 21 disposed on the supporting substrate 1, including a dielectric layer 4 and a pair of electrodes 2 and 5 sandwiching the dielectric layer 4; and a sealant that seals the capacitor element 21 through a space 22. The dielectric layer 4 has an exposed part 23 exposed in the space 22. According to this structure, deterioration of the dielectric layer can be prevented, and a capacitor device exhibiting a good leakage current characteristic is obtained.

21 Claims, 26 Drawing Sheets

FOREIGN PATENT DOCUMENTS

| | | |
|---|---|---|
| JP | H08-340090 A | 12/1996 |
| JP | 11-260667 | 9/1999 |
| JP | H11-260667 A | 9/1999 |
| JP | 2000-357360 A | 12/2000 |
| JP | 2000-357630 | 12/2000 |
| JP | 2001-085272 A | 3/2001 |
| JP | 2004-207630 | 7/2004 |
| JP | 2004-207630 A | 7/2004 |
| JP | 2005-236089 A | 9/2005 |
| JP | 2005-340470 A | 12/2005 |
| JP | 2006-196704 | 7/2006 |
| JP | 2006-196704 A | 7/2006 |
| WO | WO 2005101502 A1 * | 10/2005 |

OTHER PUBLICATIONS

International Search Report dated Dec. 25, 2007 issued by the Japanese Patent Office for International Application No. PCT/JP2007/068588.

Notice of Reasons for Rejection dated Dec. 8, 2011, issued in counterpart Japanese Application No. 2008-537480.

* cited by examiner

CAPACITOR, CAPACITOR DEVICE, ELECTRONIC COMPONENT, FILTER DEVICE, COMMUNICATION APPARATUS, AND METHOD OF MANUFACTURING CAPACITOR DEVICE

CROSS REFERENCE TO RELATED APPLICATION

The present application is the United States national stage application of international application serial number PCT/JP2007/068588, filed 25 Sep. 2007, which claims priority to Japanese patent application no. 2006-262920, filed 27 Sep. 2006 and Japanese patent application no. 2006-321805, filed 29 Nov. 2006, and Japanese patent application no. 2007-019282, filed 30 Jan. 2007, each of which is incorporated herein by reference in its entirety.

FIELD OF THE INVENTION

The present invention relates to a capacitor and a capacitor device which are mainly used in radio communication circuits of mobile communication apparatuses, etc. In particular, it relates to a capacitor and a capacitor device in which deterioration of characteristics such as a leakage current characteristic is reduced and which are stable, an electronic component including the capacitor or capacitor device, a filter device, a communication apparatus including the filter device, and a method of manufacturing the capacitor device.

BACKGROUND

A thin-film capacitor including a dielectric layer formed of a perovskite-type ferroelectric oxide thin film such as a paraelectric strontium titanate (SrTiO3) thin film or a ferroelectric strontium barium titanate ((Ba,Sr)TiO3) thin film (hereinafter also referred to as "BST film") has been proposed (e.g., refer to Japanese Unexamined Patent Application Publication No. 8-340090). A variable capacitor has also been proposed in which its capacitance characteristic is controlled by controlling the dielectric constant of the dielectric layer by applying a particular bias signal (bias voltage) to the dielectric layer (e.g., refer to Japanese Unexamined Patent Application Publication No. 11-260667). Also proposed is a variable capacitor in which a plurality of variable capacitor elements are connected in series, an external connecting electrode is disposed on a supporting substrate, and the variable capacitor elements are covered with an interlayer insulating film and a protective film (e.g., refer to Japanese Unexamined Patent Application Publication No. 2004-207630).

SUMMARY

The capacitors described above are manufactured through various thin film processes. It is generally known that the characteristics of the thin film dielectric layers change as a result of the layers being affected by these processes. This is particularly notable when the layers are composed of a dielectric material having a perovskite structure. It is also known that the characteristics of the thin film dielectric layers also change with changes in stress applied to the thin film dielectric layers due to the processes, structure, and the material for forming the capacitor. Thus, in order to stably manufacture capacitors at high reproducibility, it is important to reduce the changes in characteristics of the thin film dielectric layers caused by processes, stresses, etc.

The inventors have conducted extensive investigations and thereby found that the leakage current characteristic in particular is significantly deteriorated even with slight deterioration in the thin film dielectric layer caused by stresses applied to the thin film dielectric layer, the ambient environment, the manufacturing processes, or the like, and that it is important to suppress deterioration of the thin film dielectric layer as much as possible in order to manufacture capacitors stably at a high reproducibility.

For example, in the case where a thin film dielectric layer is covered with an interlayer insulating film or a protective film, film stresses caused by the interlayer insulating film or the protective film deteriorate the characteristics such as a leakage current characteristic of a variable capacitor. In the case where a variable capacitor is sealed inside a package with an inert gas such as nitrogen or argon introduced therein to enhance the reliability such as moisture resistance, oxygen vacancies arise due to the equilibrium reactions between oxygen in the thin film dielectric layer and the introduced atmosphere and the characteristics such as a leakage current characteristic of a variable capacitor are deteriorated as a result. In the case where a variable capacitor is resin-molded, the thin film dielectric layer becomes reduced by components in the resin and characteristics such as a leakage current characteristic of the variable capacitor are thereby deteriorated.

In a variable capacitor that utilizes the dependency of the dielectric constant of the dielectric layer on the voltage, such an issue between the dielectric layer and the leakage current characteristic has not been known to date and has been discovered by the inventors for the first time.

An object of the present invention is to provide a capacitor, a capacitor device, an electronic component, a filter device, and a communication apparatus that have high moisture resistance in which deterioration in characteristics such as a leakage current characteristic is reduced.

The present invention provides a capacitor device, including a supporting substrate, a capacitor element including a dielectric layer containing an oxide and a pair of electrodes sandwiching the dielectric layer, the capacitor element being disposed on the supporting substrate, and a sealant that seals the capacitor element through a space, in which the dielectric layer has an exposed part exposed in the space, and gas containing oxygen is introduced in the space.

In other words, according to the capacitor device of the present invention, gas containing oxygen is introduced into the space to fill the space with the gas containing oxygen.

According to the present invention, the capacitor element is sealed with the sealant through the space and moisture resistance can be ensured. Thus, the reliability can be enhanced. Since the capacitor element is not coated with a protective film or a molding resin, additional stresses from the protective film or the like are not applied to the dielectric layer. Thus, deterioration of the characteristics such as a leakage current characteristic can be reduced, and a capacitor device with stable characteristics can be provided. The dielectric layer containing the oxide has the exposed part exposed in the space, and the space is filled with the gas containing oxygen. Thus, entry of contaminants from the resin and the reduction reaction with the material constituting the dielectric layer caused by covering the capacitor element with the molding resin or the interlayer insulation film do not occur, and a capacitor device having a stable leakage current characteristic can be provided.

In particular, since the gas containing oxygen is introduced into the space, generation of new oxygen vacancies caused by the material constituting the oxide dielectric layer can be suppressed, and deterioration caused by abstraction of oxygen can be suppressed. Thus, a capacitor device having a stable leak current characteristic can be provided.

The present invention also provides a capacitor including a supporting substrate; a capacitor element group including a plurality of capacitor elements including a first capacitor element and a second capacitor element, each of the capacitor elements including a lower electrode, a dielectric layer containing an oxide, and an upper electrode sequentially stacked on the supporting substrate in the thickness direction; a first connector connected to the upper electrode or the lower electrode of the first capacitor element to electrically connect the first capacitor element to an external circuit; and a second connector connected to the upper electrode or the lower electrode of the second capacitor element to electrically connect the second capacitor element to the external circuit, in which the first connector and the second connector are connected to the external circuit to electrically connect the first capacitor element to the second capacitor element.

According to the present invention, since the plurality of capacitor elements are connected to one another via the first and second connectors and the external circuit, an interlayer insulation film or a protective film that has been necessary in the related art is not needed, and stresses from the interlayer insulation film or protective film are not applied to the dielectric layer. Thus, the leakage current can be reduced. Since the first capacitor element and the second capacitor element can be connected in series, a high frequency signal (high frequency voltage) applied to the capacitor is divided, and a capacitor having less distortions can be provided.

The present invention also provides a capacitor device including the capacitor described above; and a circuit substrate onto which the capacitor is mounted, the circuit substrate including a conductor, the first connector and the second connector electrically connecting the first capacitor element to the second capacitor element via the conductor.

According to the present invention, since the plurality of capacitor elements are connected to one another via the first and second connectors and the circuit substrate, an interlayer insulation film or a protective film that has been necessary in the related art is not needed, and stresses from the interlayer insulation film or the protective film are not applied to the dielectric layer. Thus, the leakage current can be reduced.

The present invention also provides an electronic component that for use in a resonant circuit, including the capacitor device described above.

According to the present invention, since the capacitor device in which deterioration of characteristics such as leakage current characteristic is reduced is used, reliability can be enhanced.

The present invention also provides a filter device including an input terminal, an output terminal, and a reference potential terminal, in which the electronic component described above is provided at a point on an input/output line connecting the input terminal to the output terminal or at a point between the input/output line and the reference potential terminal.

According to the present invention, since a highly reliable electronic component in which changes in characteristics are reduced is used in the filter device, the filter characteristics such as a bandpass characteristic, a attenuation characteristic, etc., can be made stable and reliability can be enhanced.

The present invention also provides a communication apparatus including the filter device described above and at least one of a receiving circuit and a transmitting circuit.

According to the present invention, since a highly reliable filter device is used, speech communication quality can be improved.

The present invention also provides a method of manufacturing a capacitor device, including a step of forming a capacitor element on the supporting substrate, the capacitor element including a dielectric layer containing an oxide and a pair of electrodes sandwiching the dielectric layer; and a step of sealing the capacitor element with a sealant through a space in an atmosphere containing oxygen, the capacitor element being sealed with the sealant so as to expose part of the dielectric layer in the space with the space containing oxygen.

According to the present invention, since the dielectric layer has the exposed part in the space and the exposed part contacts the gas containing oxygen, a capacitor device with a stable leakage current characteristic can be provided.

In view of the above, according to the present invention, a protective film or an interlayer insulation film is not needed in connecting a plurality of capacitor elements in series. Thus, stresses applied to the dielectric layer can be reduced, and a capacitor in which deterioration of characteristics such as a leakage current characteristic is reduced can be provided. Moreover, when the dielectric layer composed of an oxide has an exposed part exposed to gas containing oxygen, deterioration of characteristics of the capacitor such as a leakage current characteristic caused by reduction of the dielectric layer can be reduced, and a capacitor device with stable quality can be provided. By using a structure for sealing the capacitor through a space, a small, low-height capacitor device having good moisture resistance can be achieved. Using this quality capacitor device, an electronic component, a filter device, and a communication apparatus that have high reliability and a method of manufacturing such a capacitor device can be provided.

BRIEF DESCRIPTION OF THE DRAWINGS

The objects, features, and advantages of the present invention will become readily apparent from the following detailed description and the accompanying drawings.

DETAILED DESCRIPTION

Preferred embodiments of the present invention will now be described in detail with reference to the drawings.

A capacitor device of the present invention is first described in detail with reference to the drawings.

Figure 1:
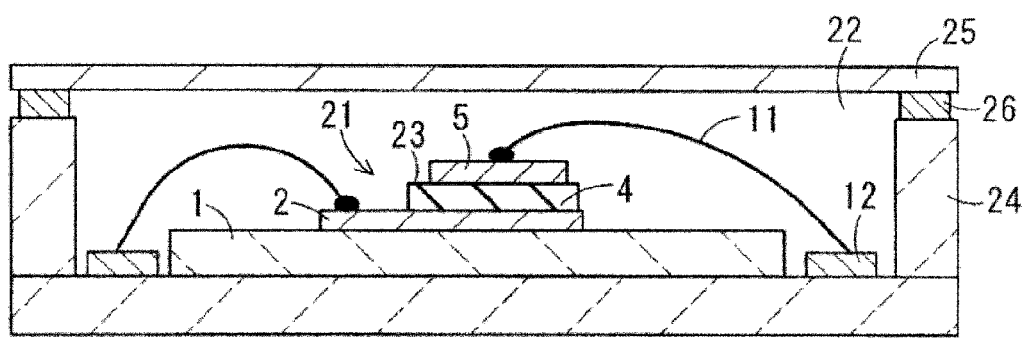
FIG. 1 is a cross-sectional view of a capacitor device according to a first embodiment of the present invention.

FIG. 1 is a cross-sectional view of a capacitor device according to a first embodiment of the present invention. In this drawing, as well as in other drawings, the same components are represented by the same reference symbols and redundant descriptions are omitted.

In FIG. 1, 1 denotes a supporting substrate, 2 denotes a lower electrode on the supporting substrate 1, 4 denotes a dielectric layer on the lower electrode 2, 5 denotes an upper electrode on the dielectric layer 4, 21 denotes a capacitor element including the lower electrode 2, the dielectric layer 4, and the upper electrode 5, 24 denotes a package composed of a ceramic such as alumina for housing the capacitor element 21, 25 denotes a cover that seals the capacitor element 21 in the package 24 through a space 22, and 26 denotes a seal ring for joining the cover 25 to the package 24. The cover 25 may be composed of Kovar (Fe—Ni—Co alloy) or Kovar electrolessly plated with Ni. The seal ring 26 may be made of Kovar or a 42 alloy (Fe-42 wt % Ni alloy) plated with Ni and Au, or the like. The package 24, the cover 25, and the seal ring 26 constitute a sealant for sealing the capacitor element 21.

The lower electrode 2 and the upper electrode 5 are a pair of electrodes that sandwich the dielectric layer 4 composed of an oxide. The dielectric layer 4 has an exposed part 23 exposed to the space 22.

The lower electrode 2 and the upper electrode 5 are connected, via metal wires 11, to terminal electrode layers 12 on the package 24, for connection to an external circuit. The terminal electrode layers 12 are connected to an external power supply circuit or the like via the package 24.

Since the capacitor element 21 is not covered with a protective film and the dielectric layer 4 has the exposed part 23 exposed to the space 22, the dielectric layer 4 is free of stresses caused by a protective film covering the dielectric layer 4. Thus, deterioration of the characteristics of the capacitor device such as leakage current is reduced. Since the capacitor element 21 is not resin-molded and the dielectric layer 4 is not in direct contact with the resin, entry of contaminants from the resin and reduction of the dielectric layer 4 can be prevented. Thus, a capacitor device with stable characteristics can be provided. A capacitor with smaller size and good moisture resistance can also be provided since the capacitor element is hermetically sealed.

The dielectric layer 4 is preferably composed of a perovskite-type oxide containing at least Ba, Sr, and Ti, since a capacitor device having a high dielectric constant, a high Q value, and a lower loss can be provided, and thus manufacture of small, large-capacity capacitor devices that are recently in high demand can be simplified.

In the case where gas containing oxygen, e.g., dry air, is introduced in the space 22, deterioration of the electrodes 2 and 5 by moisture can be prevented and an oxygen partial pressure sufficient for suppressing generation of new oxygen vacancies in the dielectric layer 4 composed of an oxide after sealing can be maintained for a long time. As a result, deterioration of characteristics of the capacitor device such as leakage current or the like after sealing can be significantly reduced, and a capacitor device with high reliability can be provided. Since the atmosphere sealed inside contains enough oxygen, oxygen depleted from the dielectric layer 4 as a result of the reduction of the dielectric layer 4 is supplied from the atmosphere to the dielectric layer 4 and thus the properties of the dielectric layer 4 remain unaffected. As a result, deterioration of the characteristics of the capacitor device such as leakage current or the like is reduced and a capacitor device with stable quality can be provided.

Oxygen vacancies are likely to be generated especially when the dielectric layer 4 is composed of BST. The oxygen vacancies also change dielectric characteristics. It is particularly important that the dielectric layer 4 have the exposed part 23 in the space 22 into which gas containing oxygen is introduced especially when the dielectric layer 4 is composed of BST.

The gas to be introduced into the space 22 should have an oxygen partial pressure sufficient for supplying oxygen for preventing deterioration of the dielectric layer 4 by allowing equilibrium reactions with oxygen in the dielectric layer 4 composed of an oxide. The gas is thus not limited to dry air.

The "dry air" does not mean air that contains no water but means air containing a relatively small amount of moisture (low humidity) compared to normal air. In particular, it refers to air dried to a relative humidity of 40% or less.

The atmosphere sealed in may be analyzed by, for example, disassembling the sealant sealing the capacitor element group, by peeling, breaking, or the like in vacuum and analyzing the discharged gas by gas chromatography, with a mass analyzer, or the like.

The humidity of the atmosphere sealed in may be measured by the following process, for example. First, samples differing in humidity of the air introduced therein are prepared and cooled to a low temperature to condense dew, and their electrical characteristics in a dew-condensed state are measured.

Then, the electrical characteristics of a sample whose humidity is to be determined are measured in a dew-condensed state at a low temperature, and compared with the results determined in advance to estimate the humidity.

In the case where the dielectric layer 4 has piezoelectricity, the capacitance-forming portion vibrates in the thickness direction under voltage application and the Q value thereby decreases periodically at particular frequencies. In contrast, in the capacitor device having the structure shown in FIG. 1, the metal wire 11 is formed above a capacitance-forming portion in the thickness direction, i.e., a portion of the capacitor element 21 where the lower electrode 2, the dielectric layer 4, and the upper electrode 5 overlap one another in the thickness direction (on the upper surface of the upper electrode 5). The metal wire 11 may be, for example, a bonding wire or the like. According to this structure, vibrations propagating in the thickness direction of the capacitance-forming portion can be scattered through the metal wire 11, and undesired resonance can be reduced. Thus, the Q value does not drop at particular frequencies, and a capacitor device that stably exhibits high Q values can be provided.

The structure shown in FIG. 1 will now be described in specifics through an example of its manufacturing method.

First, the method of manufacturing the capacitor element 21 is described.

The supporting substrate 1 is a ceramic substrate such as an alumina ceramic substrate, a single crystal substrate such as a sapphire substrate, or the like. Films that form the lower electrode 2, the dielectric layer 4, and the upper electrode 5 are formed one by one on substantially the entire surface of the supporting substrate 1. After completion of the formation of films for these layers, the films are etched sequentially into predetermine shapes to form the upper electrode 5, the dielectric layer 4, and the lower electrode 2.

The lower electrode 2 needs to have a high melting point to withstand the high temperature applied during high temperature sputtering for forming the dielectric layer 4. In particular, the lower electrode 2 is composed of a metal material such as Pt, Pd, or Ir or an oxide such as IrO2. The lower electrode 2 is also formed by high temperature sputtering. After formation of the lower electrode 2 by high temperature sputtering, the lower electrode 2 is heated to 700° C. to 900° C., which is the sputtering temperature for the dielectric layer 4, and retained thereat for a predetermined time before starting the sputtering process for the dielectric layer 4 to become a flat layer.

The thickness of the lower electrode 2 is preferably large in view of the resistance component as the electrode and the continuity of the lower electrode 2 but is preferably relatively small in view of adhesion to the supporting substrate 1. The thickness is determined by considering both views. In particular, the thickness is 0.1 μm to 10 μm. A lower electrode 2 having a thickness less than 0.1 μm will have a larger resistance and may not be able to retain continuity. At a thickness exceeding 10 μm, internal stresses become high, possibly resulting in decreased adhesion to the supporting substrate 1 or warpage of the supporting substrate 1.

The lower electrode 2 extends beyond the capacitance-forming portion.

The dielectric layer 4 may be composed of any oxide material but is preferably a dielectric layer having a high dielectric constant composed of a perovskite-type oxide crystal containing at least Ba, Sr, and Ti. The dielectric layer 4 is disposed on a surface of the lower electrode 2. For example, a film is formed to a desired thickness by sputtering using, as a target, a dielectric material from which the perovskite-type oxide crystal can be obtained. During this process, the substrate temperature is set high, e.g., to 800° C., to conduct high temperature sputtering so that a dielectric layer 4 having a high dielectric constant, a high capacitance tuning ratio, and a low loss can be obtained without conducting heat treatment after the sputtering.

The material for the upper electrode 5 is preferably Au which has a low resistivity to decrease the resistance of this layer, but Pt or the like is preferably used as an adhesion layer to enhance adhesion to the dielectric layer 4. The thickness of the upper electrode 5 is 0.1 μm to 10 μm. The lower limit of the thickness is set by considering the resistance of the upper electrode 5 itself, as with the lower electrode 2. The upper limit of the thickness is set in view of the adhesion to the dielectric layer 4.

A portion that forms the exposed part 23 can be formed by placing the upper electrode 4 to come within the dielectric layer 4 in a plan view or by exposing a side surface of the dielectric layer 4. In order to form the exposed part 23 of the dielectric layer 4 as such, it is preferable to conduct patterning from the upper electrode 5-side while preventing the top of the dielectric layer 4 from coming into contact with parts other than the upper electrode 5. In sealing the capacitor element 21 through the space 22, it is preferable not to use a sacrificial layer or the like. In this example, since the element is placed in the package 24, the element can be sealed without use of a sacrificial layer and thus a capacitor device having a high Q value can be provided.

The capacitor element 21 is formed on the supporting substrate 1 as described above.

Next, a capacitor including the capacitor element 21 on the supporting substrate 1 is placed inside the package 24 composed of alumina or the like. The terminal electrode layers 12 are provided to the package 24. The terminal electrode layers 12 may be formed by forming films of metal conductors such as Au, Cu, Ag, Ag—Pd, W, and the like by screen-printing or the like and patterning the films by etching, or by forming a conductive layer, which includes W, Ni, and Au layers stacked in that order from the bottom, by electroplating or electroless plating to obtain a desired pattern. The terminal electrode layers 12 are connected to the lower electrode 2 and the upper electrode 5 via regular metal wires 11.

Next, the seal ring 26 composed of Kovar or the like is printed on the upper part of the package 24. The cover 25 is placed on the seal ring 26 to cover the recess of the package 24 and define the space 22. The cover 25 is seam-welded to the package 24 with the seal ring 26 to obtain the capacitor device shown in FIG. 1.

Figure 2A:
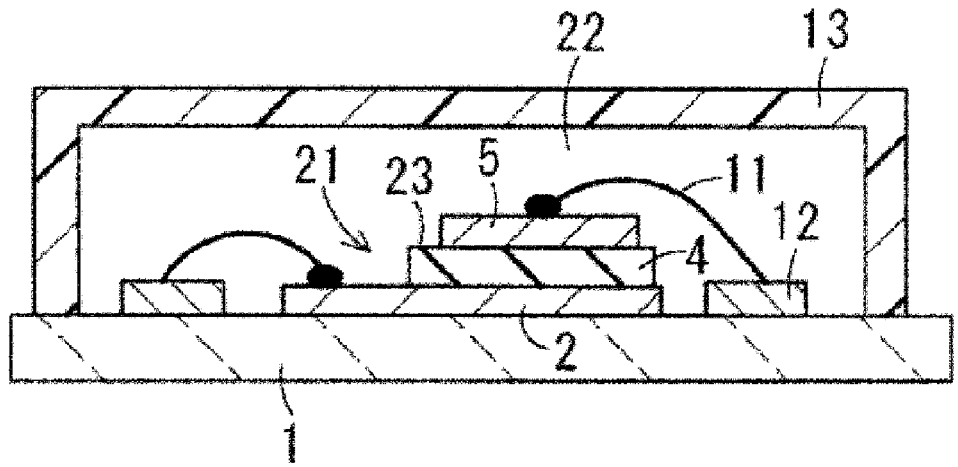
FIGS. 2A and 2B show capacitor devices according to a second embodiment of the present invention.
Figure 2B:
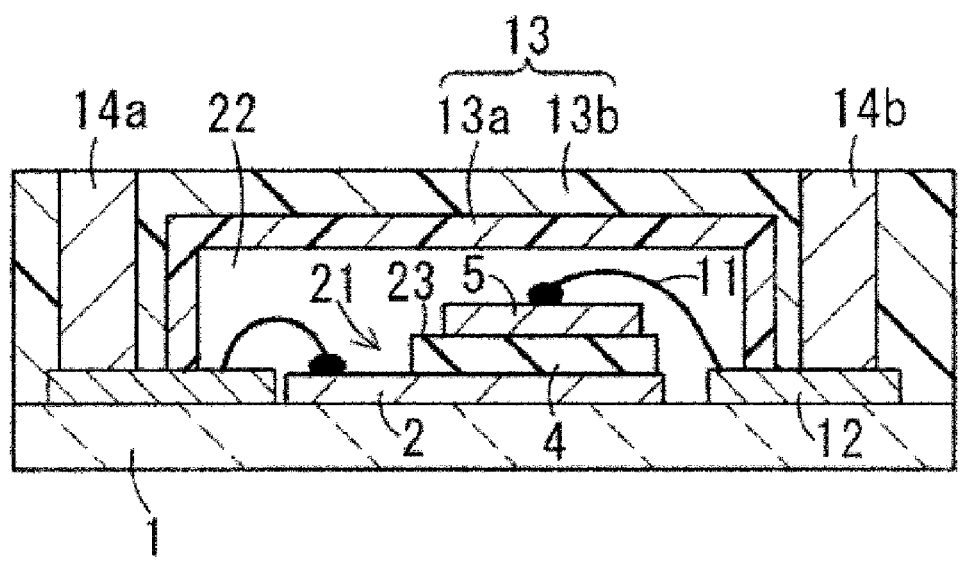

FIGS. 2A and 2B show capacitor devices according to a second embodiment of the present invention. FIG. 2A is a cross-sectional view of a capacitor device of the present invention. The capacitor device shown in FIG. 2A differs from the capacitor device shown in FIG. 1 in the structure of the sealant.

Figure 13:
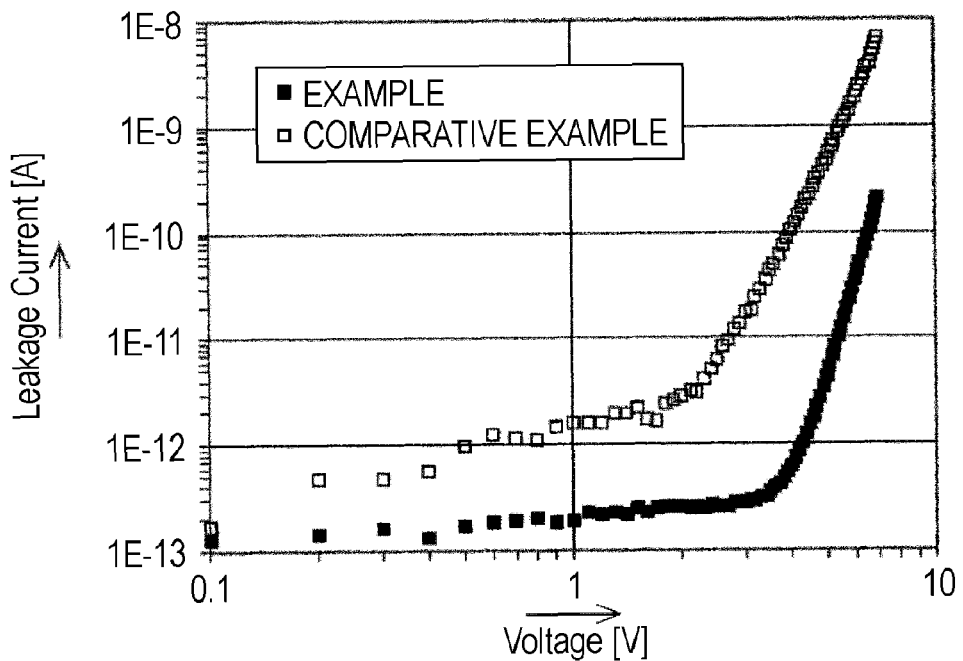
FIG. 13 is a diagram showing the I-V characteristics of a capacitor device according to Example 1 of the present invention and a capacitor device of Comparative Example before sealing.

In FIG. 2A, 13 denotes a cap member having a cap shape covering the supporting substrate 1. The cap member 13 may be, for example, a component made of an epoxy resin and rendered a cap shape in advance and joined to the supporting substrate 1. The terminal electrode layers 12 are formed on the supporting substrate 1.

The variable capacitor element 21 may be made by a process similar to that for making the capacitor element shown in FIG. 1. The terminal electrode layers 12 may be formed on the supporting substrate 1 at the same time with and by the same material for forming the lower electrode 2 or upper electrode 5 of the capacitor element 21.

Since the capacitor element 21 can be sealed with the cap member 13, the capacitor element 21 can be sealed through the space 22 with a structure simpler than that required for the capacitor device shown in FIG. 1. Thus, the size and height of the capacitor device can be reduced. Since fewer parts are required for sealing the capacitor element 21, the productivity can be enhanced.

FIG. 2B is a cross-sectional view showing a modification of the capacitor device shown in FIG. 2A.

Referring to FIG. 2B, the cap member 13 has a double layer structure, is formed on the supporting substrate 1, and includes a first cap member 13a located at the capacitor element 21-side, i.e., inner side, and a second cap member 13b disposed on the supporting substrate 1 and covering the first cap member 13a. The terminal electrode layers 12 extend beyond the region where the first cap member 13a is disposed on the supporting substrate 1, and a first columnar electrode 14a and a second columnar electrode 14b are respectively disposed on the extended portions. In other words, the first columnar electrode 14a is electrically connected to the lower electrode 2 of the capacitor element 21. The second columnar electrode 14b is electrically connected to the upper electrode 5 of the capacitor element 21. The first columnar electrode 14a and the second columnar electrode 14b have their end surfaces exposed from the upper portion of the second cap member 13b.

According to this structure, the capacitor element 21 in a hermetically sealed state can be mounted by connecting the exposed parts of the first columnar electrode 14a and the second columnar electrode 14b to an external circuit. Thus, a small, low-height capacitor element which can be mounted easily can be provided.

A capacitor device according to a third embodiment of the present invention will now be described with reference to FIG. 3A. The structure shown in FIG. 3A differs from the structures shown in FIGS. 1, 2A, and 2B in the structure of the sealant.

Figure 3A:
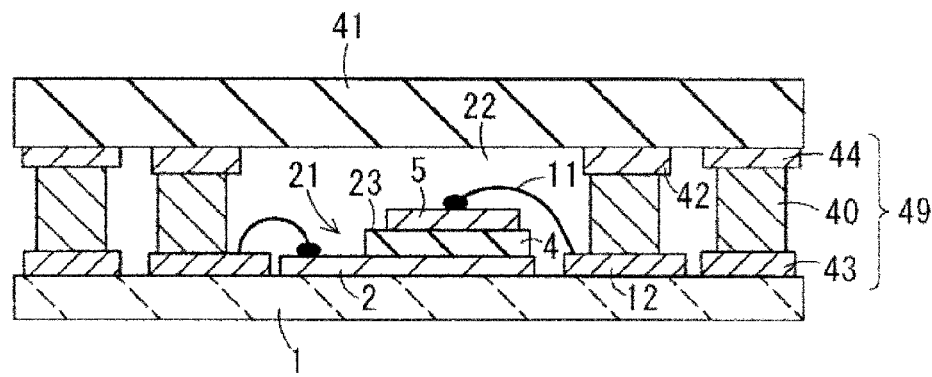
FIG. 3A is a cross-sectional view of a capacitor device according to a third embodiment of the present invention.

In FIG. 3A, reference numeral 41 denotes a circuit substrate arranged to oppose the supporting substrate 1, 42 denotes a pad portion disposed at a position corresponding to the terminal electrode layer (hereinafter also referred to as "terminal portion") 12 on the circuit substrate 41, 40 denotes a connector that electrically connects the supporting substrate 1 to the circuit substrate 41, 43 denotes an annular electrode layer surrounding the region on the supporting substrate 1 where the capacitor element 21 and the terminal portions 12 are formed, and 44 denotes an annular pad portion disposed at a position on the circuit substrate 41 corresponding to the annular electrode layer 43.

The terminal portion 12 is connected to the pad portion 42 via the connector 40, and the annular electrode layer 43 is connected to the annular pad portion 44 via the connector 40. The connectors 40 are composed of, for example, a solder material or brazing material. The annular electrode layer 43, the annular pad portion 44, and the connector 40 connecting them constitute an annular member 49.

The connector 40 in the annular member 49 may be composed of a material such as a solder, a Au—Sn solder, an anisotropic conductive resin, an epoxy resin, or the like. The annular pad portion 44 and the annular electrode layer 43 may be composed of, for example, Cr, Ni, Au, Pt, or the like.

According to this structure, the sealant includes the circuit substrate 41 and the annular member 49 that surrounds the region where the capacitor element 21 is disposed and connects the circuit substrate 41 to the supporting substrate 1 for sealing. As the circuit substrate 41 is bonded to the annular member 49, the capacitor element 21 can be sealed through the space 22. Thus, size and height reduction can be achieved and the productivity can be enhanced compared to when a package is used. When the annular member 49 is composed of a metal material such as a solder or a brazing material, the capacitor element 21 can be hermetically sealed and, as a result, the humidity can be satisfactorily shut out. Thus, a higher reliability is achieved.

Next, the structure of a capacitor device shown in FIG. 3A is described through an example of its manufacturing method.

The capacitor element 21 is formed by a process similar to the process of making the capacitor device shown in FIG. 1. The terminal electrode layers 12 may be formed on the upper surface of the supporting substrate 1 at the same time with and by the same material for forming the lower electrode 2 or the upper electrode 5. The terminal electrode layers 12 are connected to the lower electrode 2 and the upper electrode 5 via the metal wires 11 by an existing technique.

The annular electrode layer 43 surrounds the region of the upper surface of the supporting substrate 1 where the capacitor element 21 is formed. The annular electrode layer 43 may be formed at the same with and by the same material for forming the lower electrode 2 or the upper electrode 5.

The connectors 40 are then formed on the upper surfaces of the terminal electrode layers 12 and the annular electrode layer 43. The connectors 40 are to be connected to the pad portions 42 and the annular pad portion 44 on the circuit substrate 41 described below, to facilitate mounting onto the circuit substrate 41. The annular electrode layer 43 forms a sealing space enclosing the region where the capacitor element 21 is formed as the annular electrode layer 43 connects to the annular pad portion 44 on the circuit substrate 41 described below and prevents entry of humidity into this sealed (enclosed) space. Moreover, the annular electrode layer 43 enhances the mechanical strength of the capacitor device. The connectors 40 are usually formed by applying a solder paste by printing through a predetermined mask and conducting a reflow process.

The circuit substrate 41 is composed of an insulating material and, for example, a laminate having a plurality of insulating layers may be used as the circuit substrate 41. The insulating layers are composed of, for example, ceramics such as low temperature co-fired ceramics (LTCC) and alumina ceramics, and glass ceramics. The circuit substrate 41 is formed by preparing green sheets from a slurry made by homogeneously kneading a metal oxide such as a ceramic and an organic binder in an organic solvent or the like, forming desired conductor patterns or through conductor patterns (via holes) in the green sheets, stacking and press-bonding the green sheets to form a green compact, and firing the green compact. The circuit substrate 41 is not limited to a laminate and may be an alumina substrate or the like.

The pad portions 42 and annular pad portion 44 to be connected to the connectors 40 are formed on a surface (upper surface or front surface) of the circuit substrate 41 to which the supporting substrate 1 is to be connected.

For example, the pad portions 42 and the annular pad portion 44 are formed by forming films of metal conductors such as Au, Cu, Ag, Ag—Pd, W, or the like by screen printing or the like and patterning the films by etching, or by forming a conductive layer in which W, Ni, and Au are stacked in that order from the bottom by electroplating or electroless plating to obtain a desired pattern.

Then the circuit substrate 41 is joined to the supporting substrate 1.

In particular, the annular pad portion 44 of the circuit substrate 41 is arranged to align with the annular electrode layer 43 on the supporting substrate 1, and a reflow melting process is conducted in a reflow furnace at 240° C. for 5 minute to join the two substrates via the connectors 40 composed of a solder to make the capacitor device shown in FIG. 3A.

Figure 3B:
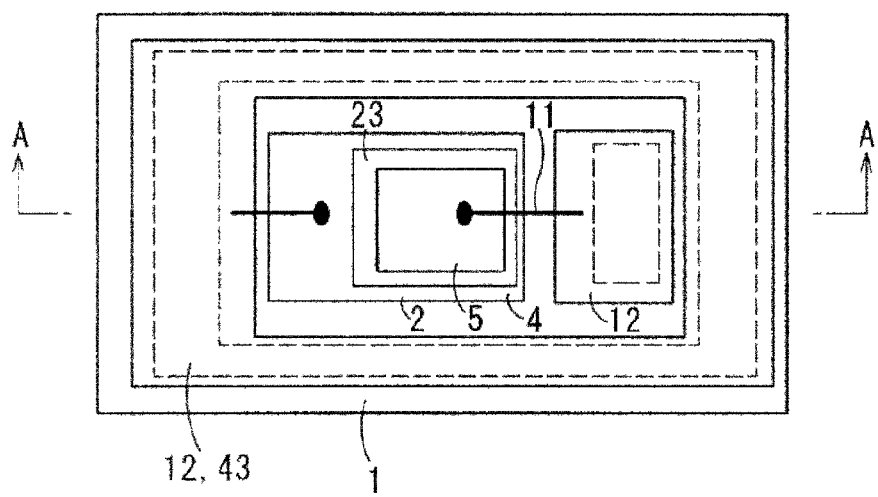
FIGS. 3B and 3C are respectively a plan view and a cross-sectional view of a modification thereof.
Figure 3C:
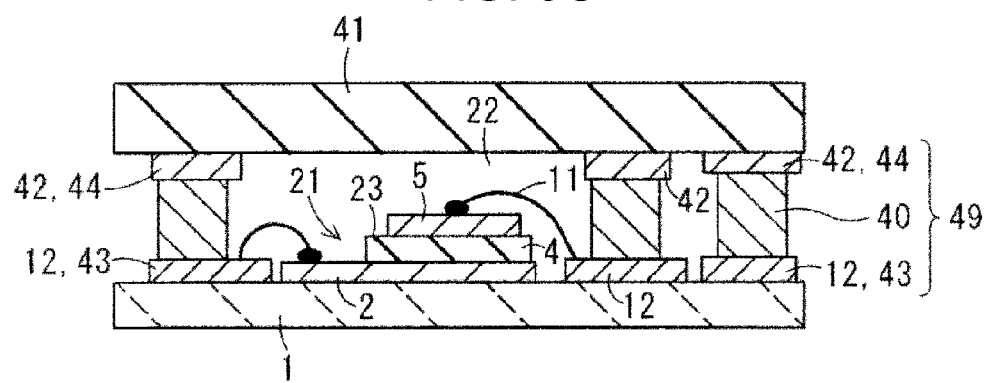

FIGS. 3B and 3C show a modification of the capacitor device shown in FIG. 3A. FIG. 3B is a plan view showing the modification of FIG. 3A, and FIG. 3C is a cross-sectional view taken along line A-A in FIG. 3B. To help understand the structure, the connectors 40 and the circuit substrate 41 thereabove are omitted from the drawing of FIG. 3B, and the portions where the connectors 40 are formed are indicated by dotted lines.

Whereas the terminal electrode layer 12 and the annular electrode layer 43 are separate components in FIG. 3A, according to the structure shown in FIGS. 3B and 3C, one (first terminal) of the two terminal electrode layers 12 is formed to surround the region where the capacitor element 21 and the other (second terminal) of the terminal electrode layers 12 are formed, and thus functions as the annular electrode layer 43. According to this structure, in comparison to the capacitor device shown in FIG. 3A, no additional structure is necessary to join the circuit substrate 41 to the supporting substrate 1, and further size reduction of the capacitor device is possible. When a high voltage is applied to the capacitor element 21 and heat is generated, the heat can be released to a larger circuit substrate 41 via the first terminal, and a capacitor device with a higher reliability can be provided.

According to this structure, one of the terminal electrode layers 12 functions as part of the annular member 49.

In the examples shown in FIGS. 2A, 2B, 3A and 3B, the terminal electrode layers 12 are electrically connected to the electrodes 2 and 5 of the capacitor element 21 via the metal wires 11. Since the variable capacitor element 21 can be connected to the terminal electrode layers 12 without providing an interlayer insulating layer, the area of the exposed part 23 can be increased, reduction reaction of the dielectric layer caused by formation of interlayer insulating layer can be avoided, and a capacitor device with stable characteristics can be provided.

In the examples shown in FIGS. 2A, 2B, 3A, and 3B, the terminal electrode layers 12 are electrically connected to the capacitor element 21 via the metal wires 11. However, the metal wires 11 are not always necessary. For example, the portion of the lower electrode 2 that extends beyond the capacitance-forming portion may function as the terminal electrode layer 12. To be more specific, in FIGS. 2A, 2B, 3A, and 3B, the extended part of the lower electrode 2 and the terminal electrode layer 12 may be formed as an integral part.

Alternatively, the dielectric layer 4 may be extended beyond the capacitance-forming portion onto the supporting substrate 1 and the upper electrode 5 may be extended onto the supporting substrate 1 via the dielectric layer 4 to impart the terminal electrode layer 12 function to these extended portions. To be more specific, the extended portion of the upper electrode 5 and the terminal electrode layer 12 may be formed as an integral part.

It is preferable not to use the metal wires 11 since various techniques can be applied to forming the cap member 13 shown in FIGS. 2A and 2B. For example, the cap member 13 may be formed by providing a sacrificial layer, forming a layer covering the sacrificial layer, forming a through hole in the layer, removing the sacrificial layer from the through hole, and covering the through hole.

Figure 4:
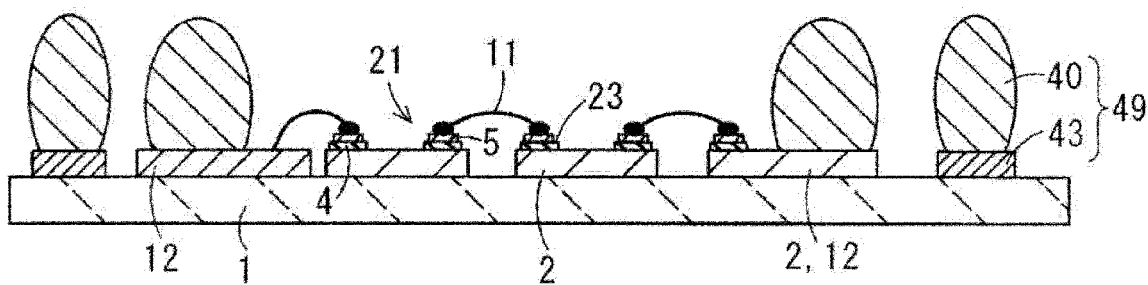
FIG. 4 is a cross-sectional view showing a modification of the capacitor device of the present invention.

In the examples shown in FIGS. 1, 2A, 2B, 3A, and 3B, a capacitor device including one capacitor element 21 is described. However, as shown in FIG. 4, a plurality of capacitor elements 21 (five in the example shown in FIG. 4) may be provided. FIG. 4 is a cross-sectional view showing a modification of the capacitor device of the preset invention, in which five capacitor elements 21 are connected in series between two terminal electrode layers 12. In FIG. 4, the sealant is omitted from the drawing. The capacitor elements 21 may be connected in series by sharing the lower electrode 2 or connecting the upper electrodes 5 to one another via the metal wires 11, for example. In the case where a plurality of capacitor elements 21 are provided as such, the lower electrode 2 and the upper electrode 5 of each capacitor element 21 can be considered to be connected to the first and second terminals 12 via other capacitor elements 21. It should be noted here that one of the capacitor elements 21 connected via a metal wire 11 is referred to as a "first capacitor element" and the other is referred to as a "second capacitor element". The capacitance of the entire capacitor device can be adequately designed by providing a plurality of capacitor elements 21 as such. Since the capacitor elements 21 are connected in series, a high frequency voltage applied between the two terminal electrode layers 12 is divided among the plurality of capacitor elements 21 and thus a capacitor device only lightly affected by high frequency voltage can be provided.

Since the first capacitor element and the second capacitor element are respectively connected to the terminal electrode layers 12 via the metal wires 11, a plurality of capacity elements can be connected without providing an interlayer insulating layer, the area of the exposed part 23 can be increased, and as a result, reduction reaction in the dielectric layer 4 can be avoided and a capacitor device with stable characteristics can be provided.

Note that a capacitor device in which the dielectric layer 4 has an exposed part 23 exposed in the space 22 can be formed by using the sealant shown in FIGS. 3A and 3B in the capacitor shown in FIG. 4. Alternatively, the sealants shown in FIGS. 1, 2A, and 2B can be used instead of the connectors 40 and the annular electrode layer 43.

A fourth embodiment of the present invention will now be described with reference to FIGS. 5 to 8. The structure of the fourth embodiment is close to the case in which the sealant shown in FIGS. 3A and 3B is used in the structure shown in FIG. 4. The differences are that bias lines are provided to change the capacitance by applying DC voltage to the capacitor element 21 and that wiring patterns on the circuit substrate 41 are used to connect a plurality of capacitor elements to each other. A layer having a dielectric coefficient that varies in response to the voltage applied through the bias lines is used as the dielectric layer 4 of the capacitor element 21.

Figure 5:
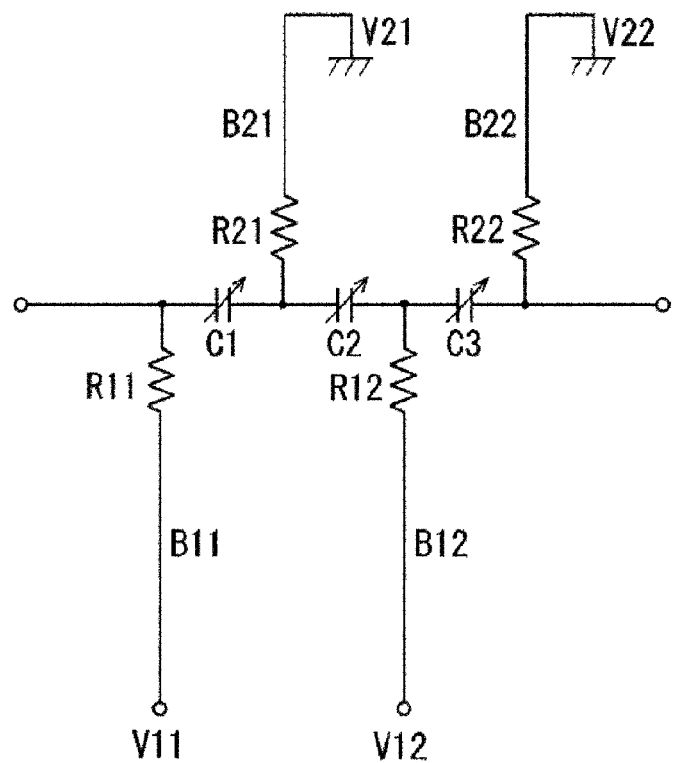
FIG. 5 is an equivalent circuit diagram of a capacitor device according to a fourth embodiment of the present invention.
Figure 6:
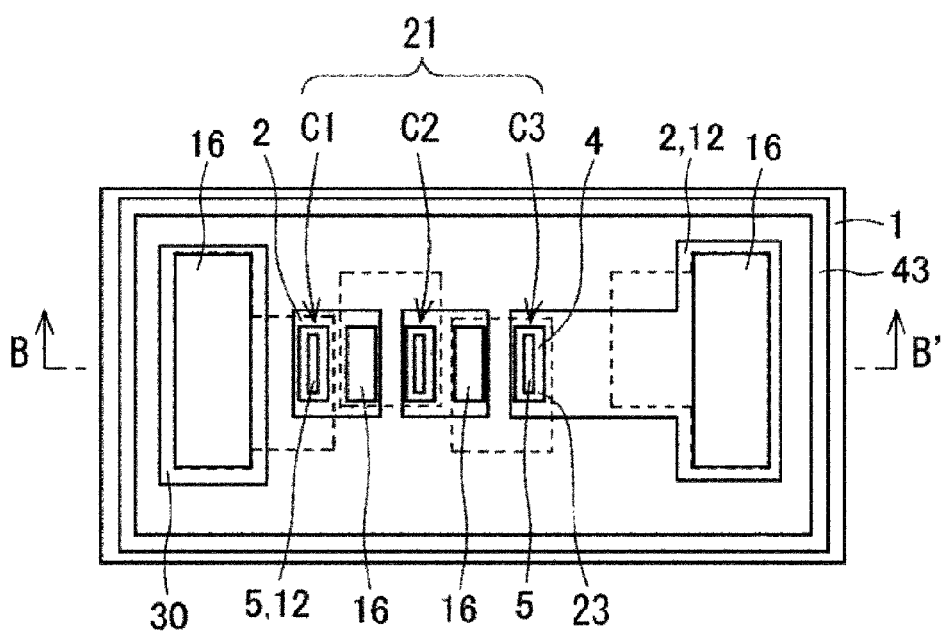
FIG. 6 is a see-through plan view of a capacitor on a supporting substrate of the capacitor device according to the fourth embodiment of the present invention.
Figure 7:
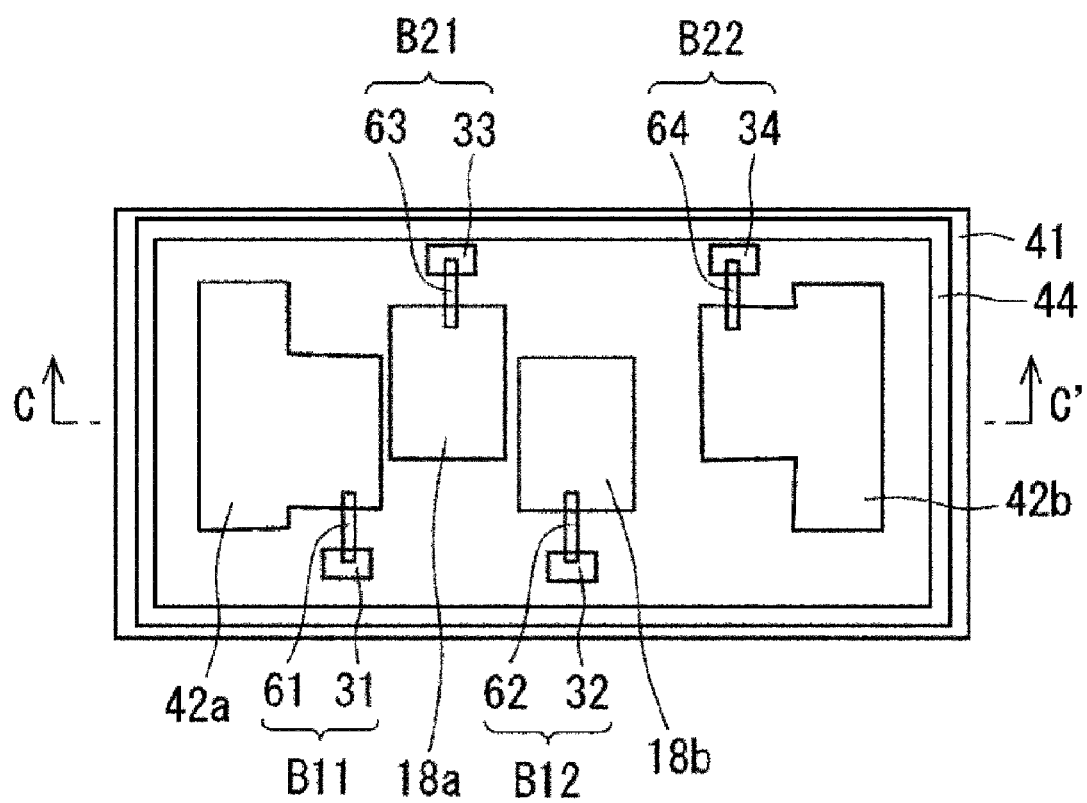
FIG. 7 is a see-through plan view of a capacitor on a circuit substrate of the capacitor device according to the fourth embodiment of the present invention.
Figure 8:
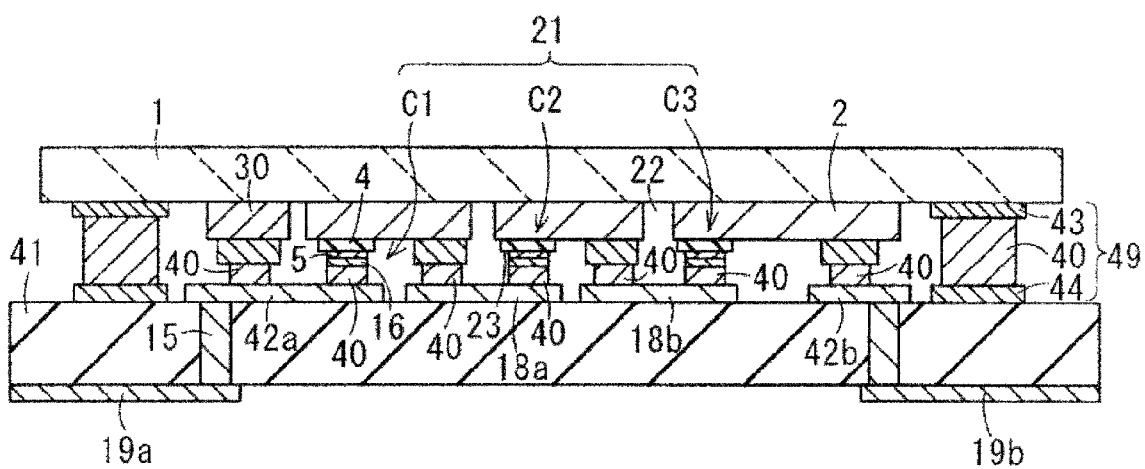
FIG. 8 is a cross-sectional view of the capacitor device according to the fourth embodiment of the present invention.

FIGS. 5 to 8 show an example of a capacitor device serving as a variable capacitor and including three capacitor elements 21. FIG. 5 is an equivalent circuit diagram, FIG. 6 is a see-through plan view of the capacitor on the supporting substrate 1 connected to the circuit substrate 41 as viewed from the rear side of the supporting substrate 1, FIG. 7 is a plan view of the circuit substrate 41 to which the capacitor shown in FIG. 6 is connected, and FIG. 8 is a cross-sectional view of a capacitor device including the capacitor shown in FIG. 6 connected to the circuit substrate 41 shown in FIG. 7, the cross-sectional view being taken along lines B-B' in FIG. 6 and C-C' in FIG. 7. In FIG. 6, the regions indicated by dotted lines indicate the positions at which wiring patterns 45 on the circuit substrate 41 are to be formed, as described below.

In the equivalent circuit diagram of FIG. 5, reference symbols C1, C2, and C3 each denote a capacitor element 21, B11 and B12 each denote a first bias line including at least one of a resistor component and an inductor component (in the drawing, resistor components R11 and R12 are shown), B21 and B22 each denote a second bias line including at least one of a resistor component and an inductor component (in the drawing, resistor components R21 and R22 are shown), V11 and V12 denote bias terminals respectively connected to the first bias lines B11 and B12, and V21 and V22 denote bias terminals respectively connected to the second bias lines B21 and B22.

The capacitor elements C1 to C3 are connected in series between the input/output terminals for input/output of high frequency signals. The first bias lines (B11 and B12) and the second bias lines (B21 and B22) are alternately connected between one of the input/output terminals and the capacitor element C1, between the capacitor elements C1 and C2, between the capacitor elements C2 and C3, and between the capacitor element C3 and the other input/output terminal. The bias lines B11 to B22 need to have a lower resistance than the insulation resistance of the capacitor elements C1 and C3 in direct current and a higher impedance than the impedance of the capacitor elements C1 to C3 in alternate current. The DC voltage applied to the capacitor element is determined by voltage division on the basis of the resistance of each bias line and the insulation resistance of each capacitor element. The resistance is thus low in DC when an inductor or a λ/4 line is used, and the DC voltage applied to each capacitor element by division can be increased in comparison with the case of using a resistor.

In a capacitor device having such a structure, a high frequency signal flows between the input/output terminals through the capacitor elements C1, C2, and C3 connected in series.

A bias signal for controlling the capacitance component of the capacitor element C1 is supplied from the bias terminal V11 and flows to the bias terminal V21 (ground in FIG. 5) through the capacitor element C1. The capacitor element C1 exhibits a particular dielectric constant in response to the voltage applied to the capacitor element C1, and a desired capacitance component can be obtained as a result. Likewise, bias signals are supplied from the bias terminal V12 to the capacitor elements C2 and C3, and flow to the bias terminals V21 and V22 (ground) via the capacitor elements C2 and C3. The capacitor elements C2 and C3 exhibit particular dielectric constants in response to the voltage applied to the capacitor elements C2 and C3, and desired capacitance components can be obtained as a result. In other words, since the capacitor elements C1 to C3 are DC-connected in parallel, a bias signal having a magnitude equal to that of the bias signal DC-applied from the bias terminal is applied to the capacitor element, and a desired capacitance component can thus be obtained.

Accordingly, DC bias signals for controlling the capacitance of the capacitor elements C1, C2, and C3 to desired levels can be stably supplied to the capacitance elements C1, C2, and C3 individually, and the dielectric constants of the dielectric layers of the capacitance elements C1, C2, and C3 can be adjusted to desired levels by application of the bias signals. Thus, with this capacitor device, the capacitance components are easy to control.

The high frequency signals input to the capacitor device, i.e., the high frequency signals input to the capacitor elements C1, C2, and C3 do not leak through the first bias lines B11 and B12 and the second bias lines B21 and B22 because the resistor components R11, R12, R21, and R22 work as large impedance components relative to the impedances of the capacitor elements C1, C2, and C3 in the frequency range of the high frequency signals. Thus, in the frequency range of the high frequency signals, the Q value of the capacitor device remains unaffected by the resistor components of the bias lines and thus the capacitor device can exhibit a high Q value.

In other words, in this capacitor device, N (where N is an integer of 2 or more) capacitor elements, i.e., the three capacitor elements C1, C2, and C3, can be considered as capacitor elements connected in series in terms of high frequency.

The high frequency voltage applied to the capacitor elements C1, C2, and C3 connected in series are divided upon the capacitor elements C1, C2, and C3; thus, the high frequency voltage applied to each of the capacitor elements C1, C2, and C3 is decreased. Thus, fluctuation of capacitance with the high frequency signals can be suppressed to a low level, and waveform distortions, intermodulation distortions, and the like can be suppressed.

Connecting the capacitor elements C1, C2, and C3 in series has the same effect as increasing the thickness of the dielectric layer of the capacitor element in terms of high frequency. The calorific value per unit volume caused by insertion loss of the capacitor device can thereby decreased and the power durability can be enhanced.

Alternatively, the first bias lines B11 and B12 may be electrically connected to each other and the bias terminal V11 and the bias terminal V12 may be made common. Similarly, the second bias lines B21 and B22 may be electrically connected to each other and the bias terminals V21 and the bias terminal V22 may be made common.

In the case where an odd number of capacitor elements are connected, the input/output terminals of the high frequency signals and the bias terminals of the bias signals may be made common.

Next, a specific structure of a capacitor device according to a fourth embodiment of the present invention is described through an example of its manufacturing method.

In FIGS. 6 to 8, reference numerals 31 to 34 each denote a conductor unit and 61 to 64 each denote a printed resistor. The input/output terminals for the high frequency signals include a first signal terminal (input terminal) and a second signal terminal (output terminal) and are each constituted by the terminal electrode layer 12, a solder diffusion-preventing layer 16, and a connector 40.

First, the structure of the capacitor on the supporting substrate 1 is described with reference to FIG. 6. To help understand structures of individual components, the connectors 40 and part of the solder diffusion-preventing layer 16 thereabove are omitted from the drawing.

Each of the capacitor elements C1 to C3 includes a capacitance-forming portion where the lower electrode 2, the dielectric layer 4, and the upper electrode 5 overlap each other and an extended portion of the lower electrode 2 that extends beyond the capacitance-forming portion. The solder diffusion-preventing layer 16 is formed on the upper electrode 5 and the extended portion of the lower electrode 2, and the connector 40 is formed on the top. The connector 40 of the capacitor element C1 on the extended portion of the lower electrode 2 and the connector 40 of the capacitor element C2 on the upper electrode 5 are connected to one wiring pattern formed on the circuit substrate 41. The capacitor element C1 is thereby connected to the capacitor element C2 in series.

Similarly, the capacitor elements C2 and C3 are connected in series. The dielectric layer 4 of the capacitor element C1 and the extended portion of the lower electrode 2 of the capacitor element C3 function as the terminal electrode layers 12.

The terminal electrode layers 12 are connected to the pad portions 42 on the circuit substrate 41 to form a capacitor device including variable capacitor elements C1 to C3 connected in series between the input terminal and the output terminal.

According to this structure, the capacitor elements can be connected in series without coating them with an interlayer insulating film or a protective film as in the related art. Since the stresses from the interlayer insulating film or protective film are not applied to the dielectric layer 4, deterioration in characteristics such as leakage current of the capacitor device can be reduced.

The capacitor elements C1, C2, and C3 are prepared as with the capacitor element 21 of the capacitor device shown in FIG. 1. The solder diffusion-preventing layer 16 is formed on the upper surface of the upper electrode 5 and the portion of the lower electrode 2 extending beyond the capacitance-forming portion.

The solder diffusion-preventing layer 16 is formed to prevent diffusion of the connector 40 into the lower electrode 2 during reflow or mounting of the connector 40 composed of a solder. The material for the solder diffusion-preventing layer 16 is preferably nickel. The surface of the solder diffusion-preventing layer 16 may be coated with a film about 0.1 µm in thickness composed of a material, such as gold or copper, having a high solder wettability to improve the solder wettability.

The annular electrode layer 43 is disposed on the upper surface of the supporting substrate 1 by surrounding the region where a capacitor element group including the capacitor elements C1, C2, and C3 are formed. The annular electrode layer 43 may be formed at the same time with and by the same material for forming the lower electrode 2 and the upper electrode 5. The solder diffusion-preventing layer 16 may be formed on the annular electrode layer 43.

Lastly, the connectors 40 are formed on the solder diffusion-preventing layers 16 to complete manufacture of the capacitor shown in FIG. 6. The connectors 40 are connected to the wiring patterns 45, the pad portions 42, and the annular pad portion 44 disposed on the circuit substrate 41 described below, thereby connecting the capacitor elements C1, C2, and C3 in series and facilitating mounting onto the circuit substrate 41. As the annular electrode layer 43 connects to the annular pad portion 44 on the circuit substrate 41 described below, a sealing space for enclosing the region where the capacitor element group is formed is created to prevent entry of humidity into this sealed (enclosed) space. The annular electrode layer 43 is also formed to increase the mechanical strength of the capacitor device. The connectors 40 are usually formed by applying a solder paste by printing through a particular mask and conducting a reflow process.

The connectors 40 constituting the annular member 49 may be composed of the same material as in the capacitor device shown in FIG. 3A.

The connectors 40 disposed on the upper electrode 5 of the capacitor element C1 and the lower electrode 2 of the capacitor element C3 function as the input/output terminals for high frequency signals together with the solder diffusion-preventing layers 16.

According to this structure, the portions connecting the capacitor elements C1, C2, and C3 to one another are all exposed in the upper surface. Thus, mounting to the circuit substrate 41 is simplified.

It should be noted that an auxiliary connecting portion 30 is provided outside the capacitor element C1 to increase the connecting strength between the supporting substrate 1 and the circuit substrate 41. The auxiliary connecting portion 30 may be formed at the same time as and by the same material for forming the lower electrode 2 or the upper electrode 5. The solder diffusion-preventing layer 16 and the connector 40 are formed on the upper surface of the auxiliary connecting portion 30 to connect the auxiliary connecting portion 30 to the circuit substrate 41.

The structure of the circuit substrate 41 will now be described with reference to FIGS. 7 and 8.

The circuit substrate 41 may be composed of the same material as in the capacitor device shown in FIG. 3A.

Wiring patterns 18 to be connected to the connectors 40, the pad portions 42, and the annular pad portion 44 are formed on a surface (upper surface or front surface) of the circuit substrate 41 to which the supporting substrate 1 is connected.

The wiring patterns 18, the pad portions 42, and the annular pad portion 44 are formed by, for example, forming films of metal conductors such as Au, Cu, Ag, Ag—Pd, W, or the like by screen printing or the like and patterning the films by etching, or by forming a conductive layer in which W, Ni, and Au are stacked in that order from the bottom by electroplating or electroless plating to obtain a desired pattern.

The circuit substrate 41 is provided with a pad portion 42a that connects, to an external circuit, the connector 40 serving as an input/output terminal disposed on the upper electrode 5 of the capacitor element C1, a wiring pattern 18a that connects the lower electrode 2 of the capacitor element C1 to the upper electrode 5 of the capacitor element C2, a wiring pattern 18b that connects the lower electrode 2 of the capacitor element C2 to the upper electrode 5 of the capacitor element C3, a pad portion 42b that connects, to an external circuit, the connector 40 serving as an input/output terminal disposed on the lower electrode 2 of the capacitor element C3, and the annular pad portion 44 that surrounds these components.

The circuit substrate 41 is equipped with the bias lines B11, B12, B21, and B22 that constitute a bias supply circuit for applying voltage to the capacitor elements C1, C2, and C3. Since the circuit substrate 41 is equipped with the bias lines B11 to B22, it becomes possible to incorporate a resistor, an inductor, a λ/4 line, and the like at the circuit substrate 41-side or form these components on the surface of the circuit substrate 41 or the like. Accordingly, the size of the device does not increase by using an inductor and a λ/4 line as the bias lines, and desired bias lines can be formed. Since the bias lines can be formed separately from the capacitor element group, the bias lines can be easily formed on the circuit substrate 41 with an optimum material. The first bias lines B11 and B12 of the bias supply circuit include printed resistors 61 and 62 and conductor portions 31 and 32 respectively connected thereto. Similarly, the second bias lines B21 and B22 include printed resistors 63 and 64 and conductor portions 33 and 34 respectively connected thereto.

The printed resistors 61 to 64 are composed of RuO2 or a like material. Their resistance is set not to adversely affect the impedance of the capacitor device at the operation frequency. For example, in the cases where the capacitor device is used at a frequency of 1 GHz and the capacitance of the capacitor elements C1 to C3 is 5 pF, the resistance of the printed resistors 61 to 64 is set to a value at least 10 times larger than the impedance of the capacitor elements C1 to C3 at 100 MHz so as not to adversely affect the impedance from 1/10 (100 MHz) of the operation frequency. In such a case, the required resistance of the first and second bias lines B11, B12, B21, and B22 should be set to about 3.2 kΩ or more.

The material for the conductor portions 31 to 34 is preferably a noble metal, such as Au, Ag, Cu, or the like, having a low resistivity or an alloy containing the noble metal to suppress the variation in the resistance of the first and second bias lines B11 to B12 and B21 to B22. However, since the resistance of the printed resistors 61 to 64 is sufficiently high, Ag may be used as the material for the bias lines and the circuit substrate 41 may be composed of LTCC so that they can be co-fired.

Penetrating conductors 15 are composed of a conductor such as Ag or the like. They are each formed by introducing, for example, a Ag-based conductor paste into a through hole (via hole) formed at a desired position of a green sheet by micro drilling, punching, laser processing, die blanking, photolithography, or the like, or by electroless plating. The penetrating conductors 15 allow the input/output terminals to extend from the upper surface to the lower surface of the circuit substrate 41. Similarly, the bias supply circuit can extend from the upper surface to the lower surface of the circuit substrate 41.

The annular pad portion 44 at the circuit substrate 41-side has a shape corresponding the annular electrode layer 43 on the supporting substrate 1 and is formed by forming a layer composed of Cr, Ni, Au, or the like at a predetermined position by sputtering, electroless-plating, or electroplating. The annular pad portion 44 may be a single layer or a laminate of a plurality of layers.

External connecting terminals 19 connected to the input/output terminals and bias lines via the penetrating conductors 15 are formed on the lower surface of the circuit substrate 41. The external connecting terminals 19 may be composed of any conductor, e.g., a noble metal such as Ag, Au, Cu, or the like or an alloy containing the noble metal.

The circuit substrate 41 is then joined with the capacitor shown in FIG. 6 to prepare a capacitor device shown in FIG. 8.

In particular, the capacitor shown in FIG. 6 is disposed to oppose the upper surface of the circuit substrate 41 so that the annular electrode layer 43 on the supporting substrate 1 align with the annular pad portion 44 of the circuit substrate 41, and reflow-melting is conducted in a reflow furnace at 240° C. for 5 minutes to join the substrate and the capacitor with the connectors 40 composed of solder.

The annular member 49 can seal the region where the capacitor element group is formed, prevent entry of the humidity into the sealed (enclosed) space, and increase the mechanical strength of the capacitor device.

When the circuit substrate 41 is joined to the capacitor shown in FIG. 6 in the presence of gas containing oxygen, the gas containing oxygen can be introduced into the space 22 in the space 22. In particular, when the circuit substrate 41 is joined to the capacitor shown in FIG. 6 in the presence of dry air, the dry air can be introduced into the sealed space.

According to the aforementioned features of the present invention described above, no interlayer insulating film or protective film that applies stresses to the dielectric layer is necessary and a capacitor device with reduced deterioration of characteristics such as leakage current characteristics can be provided. Since the dielectric layer 4 is not easily reduced, deterioration of characteristics such as leakage current characteristic of the capacitor device can be reduced and a capacitor device with stable quality can be provided. Since a sealant including a space is used, a small, low-height variable capacitor having good moisture resistance can be provided. Since the capacitor element 21 can be sealed without requiring a sacrificial layer, a capacitor device with a high Q value can be achieved.

When bias voltage is applied from the connecting point between the capacitor element C1 and the capacitor element C2 up to the upper electrode 5 of the capacitor element C1 and the lower electrode 2 of the capacitor element C2, the direction in which the leakage current flows becomes opposite between the capacitor element C1 and the capacitor element C2. The magnitude I(−) of the leakage current in the capacitor element C1 and the magnitude I(+) of the leakage current in the capacitor element C2 have a relationship, I(−)≠I(+). The total magnitude of the leakage current in the capacitor element C1 and the capacitor element C2 is I(−)+I(+). When the polarity of the bias voltage is switched, the magnitude of the leakage current in the capacitor element C1 is indicated as I(+) and the magnitude of the leakage current in the capacitor element C2 is indicated as I(−). In this case also, the total magnitude of the leakage current in the capacitor element C1 and the capacitor element C2 is I(−)+I(+). In sum, when the capacitor element C1 and the capacitor element C2 are taken together, the difference in leakage current derived by the polarity of the bias voltage is cancelled and thus the dependence of the leakage current on the polarity can be reduced. As a result, a capacitor device having a leakage current characteristic not significantly fluctuated by switching of the polarity of the bias voltage can be obtained, and thus a highly reliable capacitor device can be provided. This effect is particularly notable when an even number of capacitor elements are provided.

In the examples shown in FIG. 6 to 8, the bias lines are all formed on the circuit substrate 41. Alternatively, some or all of the bias lines may be formed on the supporting substrate 1. In the examples shown in FIGS. 6 to 8, a plurality of capacitor elements 21 are connected to one another via the wiring patterns 18 formed on the circuit substrate 41. Alternatively, the metal wires 11 and the like may be used to connect them.

Figure 9A:
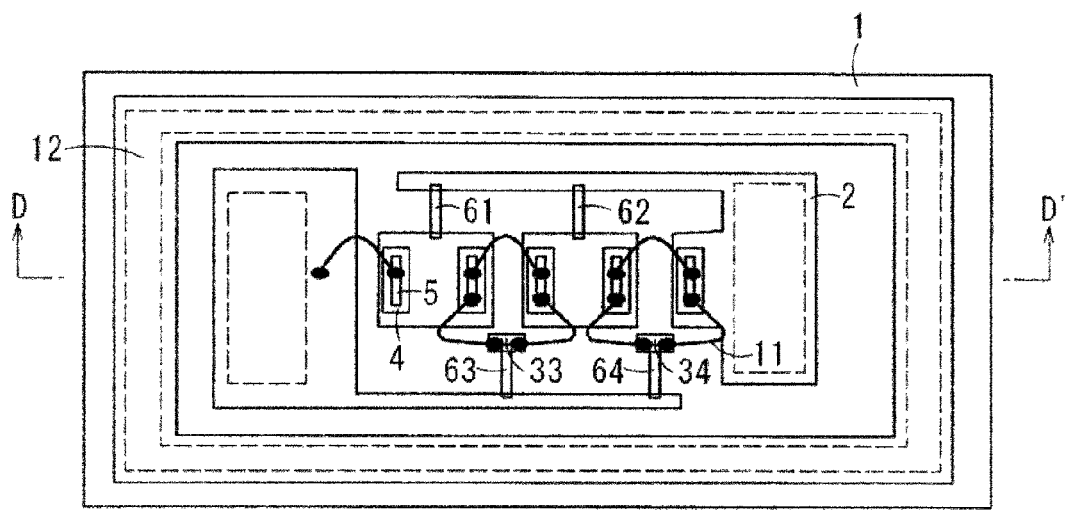
FIGS. 9A and 9B are respectively a plan view and a cross-sectional view of a principle part showing a modification of the capacitor device according to the fourth embodiment of the present invention.
Figure 9B:
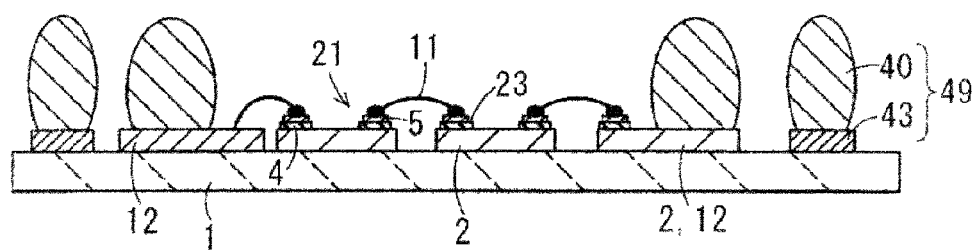

FIGS. 9A and 9B show a modification of a capacitor device of the fourth embodiment of the present invention. FIG. 9A is a plan view of a capacitor disposed on the supporting substrate 1. FIG. 9B is a cross-sectional view taken along line D-D' in FIG. 9A and is the same as FIG. 4 except that bias lines are included. In FIG. 9A, the connectors 40 provided thereabove are omitted from the drawing.

The modification shown in FIGS. 9A and 9B differs from the example shown in FIGS. 6 to 8 in that the bias lines are all formed on the supporting substrate 1, that the capacitor elements 21 are connected to each other with the metal wires 11, and the number of the capacitor elements 21.

As shown in FIGS. 9A and 9B, in forming bias lines on the supporting substrate 1, the printed resistors 61 to 64 are preferably composed of a material containing tantalum (Ta) and having a resistivity of 1 mΩ cm or more. Specific examples of the material include tantalum nitride (TaN), TaSiN, and Ta—Si—O. For example, if tantalum nitride is used as the material, the printed resistors 61 and 64 having a desired composition ratio and resistivity can be formed by reactive sputtering with a Ta target and addition of nitrogen.

Printed resistors 61 to 64 having a thickness of 40 nm or more and a resistivity of 1 mΩ cm or more can be formed by adequately selecting the conditions of the sputtering. Upon completion of the sputtering, a resist material is applied, the applied layer is worked into a particular shape, and an etching process such as reactive ion etching (RIE) is performed to easily conduct patterning. Since a material having a high resistivity can be used, a desired resistance can be obtained without increasing the aspect ratio of the printed resistors 61 to 64. As a result, the size of the capacitor device can be reduced.

Now, referring to FIGS. 10A to 10G, an example of a method of making a sealant including the cap member 13 of the capacitor device of the present invention illustrated in FIGS. 2A and 2B is described. In this example, the capacitor element 21 is connected to the terminal electrode layer 12 and the plurality of capacitor elements 21 are interconnected without using the metal wires 11. FIGS. 10A to 10G are cross-sectional views showing steps of the method of making the sealant including the cap member 13.

Figure 10A:
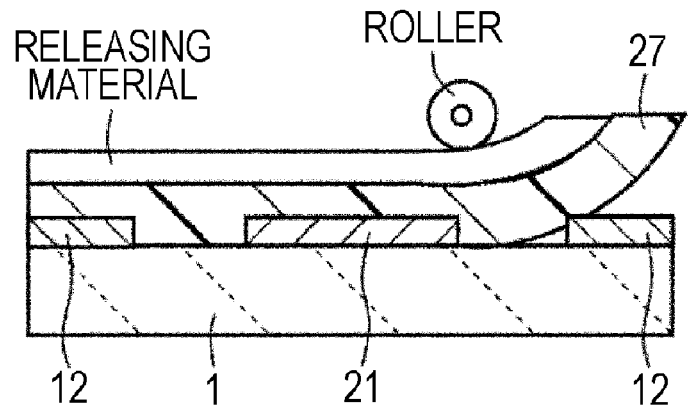
FIGS. 10A to 10G are cross-sectional views showing respective steps of the method of making a sealant of the capacitor device of the present invention.

In FIG. 10A, a negative-type film resist 27 protected with a releasing material is pressure-bonded onto the supporting substrate 1, on which the capacitor element 21 and the terminal electrode layers 12 connected to the capacitor element 21 are formed, by using a roller. After the releasing material is removed from the film resist 27, the film resist 27 is cured under heating at 100° C.

Figure 10B:
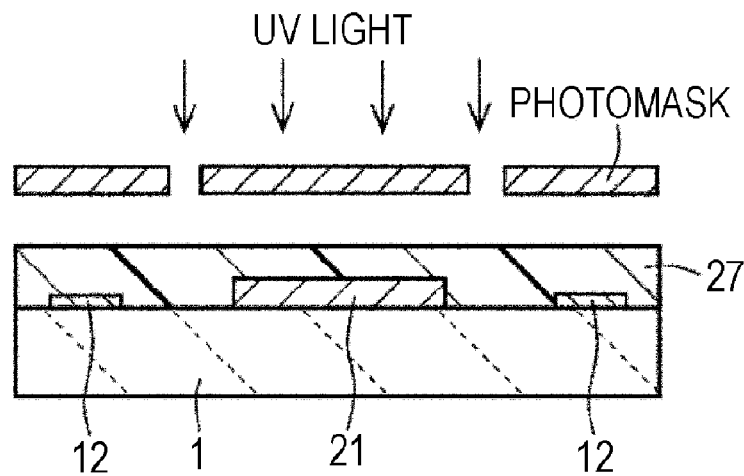

Next, as shown in FIG. 10B, a photo mask or reticle is aligned with the film resist 27 bonded onto the supporting substrate 1, UV light is applied for exposure, and only the portions irradiated with UV light are stabilized by polymerization and cross-linking reactions.

Figure 10C:
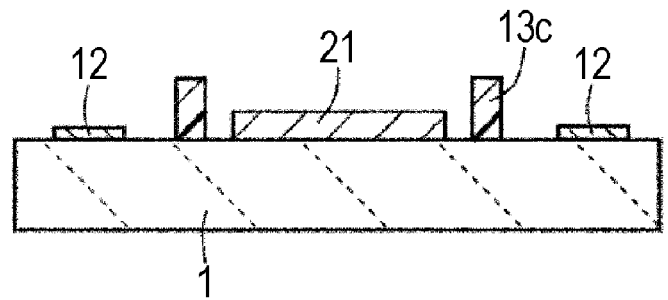

Next, as shown in FIG. 10C, development is conducted to remove the unneeded portions other than a pillar portion 13c of the cap member 13, followed by drying by baking.

Figure 10D:
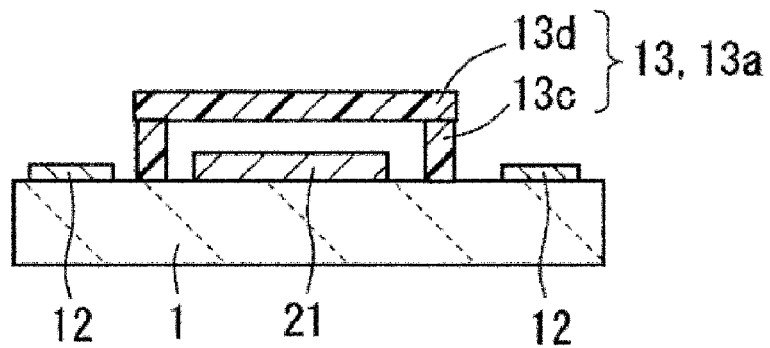

Next, as shown in FIG. 10D, the film resist 27 is disposed on the pillar portion 13c as in steps shown in FIGS. 10A and 10B and exposure and development are conducted to remove the unneeded portions other than the part that will form a cover 13d of the cap member 13, followed by drying by baking. The pillar portion 13c and the cover 13d are joined with each other by heating and thus integrate into the first cap member 13a.

Figure 10E:
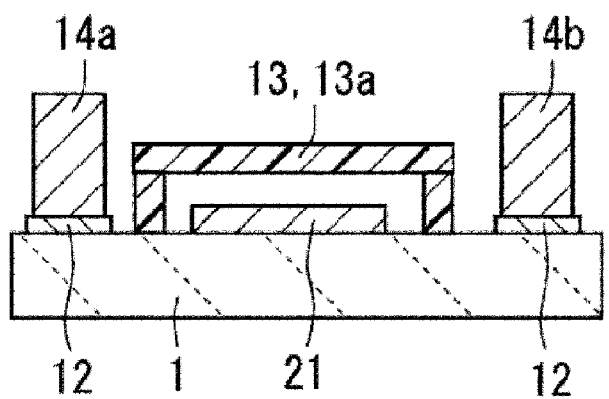

Next, as shown in FIG. 10E, a first columnar electrode 14a and a second columnar electrode 14b composed of Cu are respectively formed on the two terminal electrode layers 12 by electroless plating.

Figure 10F:
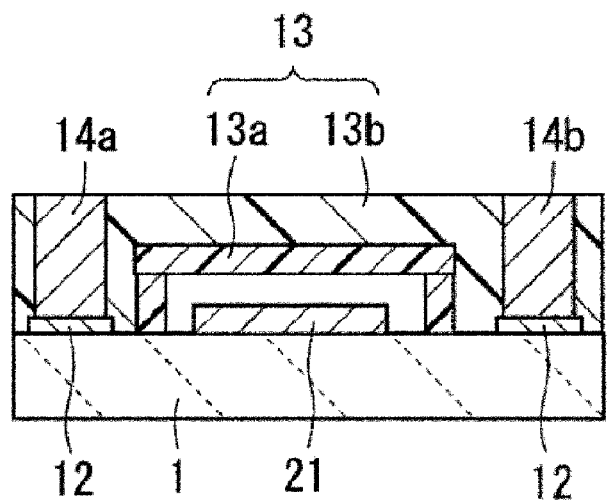

Next, as shown in FIG. 10F, a resin material such as epoxy resin is molded over the supporting substrate 1, the first cap member 13a, and the columnar electrodes 14. The resin material was machined by grinding to form a second cap member 13b with upper surfaces of the first columnar electrode 14a and the second columnar electrode 14b exposed therein.

Figure 10G:
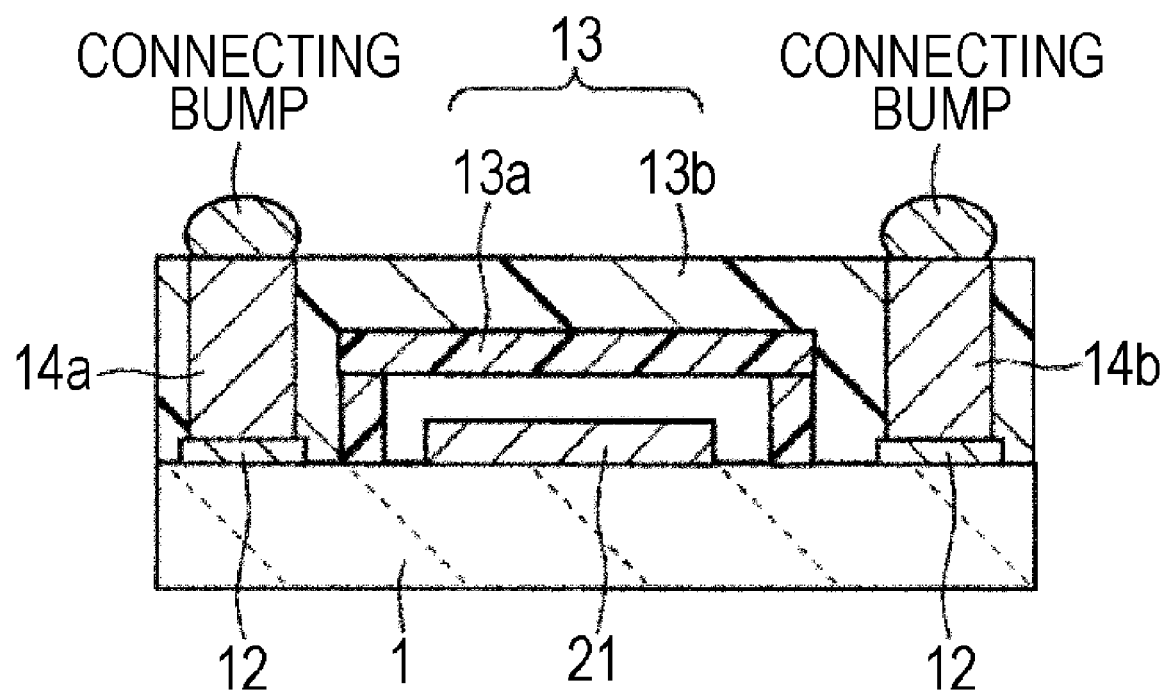

Lastly, as shown in FIG. 10G, bump connectors are formed with an electrode material such as solder on the exposed upper surfaces of the first columnar electrode 14a and the second columnar electrode 14b to obtain a capacitor device sealed with the cap member 13.

According to the manufacturing process described above, wafer-level packaging can be made possible, a surface-mounting structure can be fabricated easily, and a small, low-height capacitor can be achieved.

EXAMPLES

Changes in leakage current characteristic were investigated before and after sealing the capacitor element 21 with the sealant by taking a capacitor device of the present invention shown in FIG. 1 as an example.

A Si substrate having a surface on which a thermally oxidized film was formed was used as the supporting substrate 1. After TiO2 serving as an adhesive layer was formed on the supporting substrate 1, a lower electrode 2 composed of Pt, a dielectric layer 4 composed of BST, and an upper electrode 5 including a Pt and Au layers stacked in that order from the bottom were laminated to form a capacitor element 21. At this stage, the leakage current characteristic (I-V characteristic) before sealing was measured. The I-V characteristic was measured with Picoammeter 4140B produced by Agilent.

The capacitor element 21 was placed in a package 24 composed of alumina, and sealed by seam-welding the package 24 to a cover 25 (lid) through a seal ring 26 in a dry air atmosphere. After sealing, whether the sample was hermetically sealed was confirmed by performing a He leak test and an air leak test, and the leakage current characteristic (I-V characteristic) after sealing was measured (Example 1).

Figure 11A:
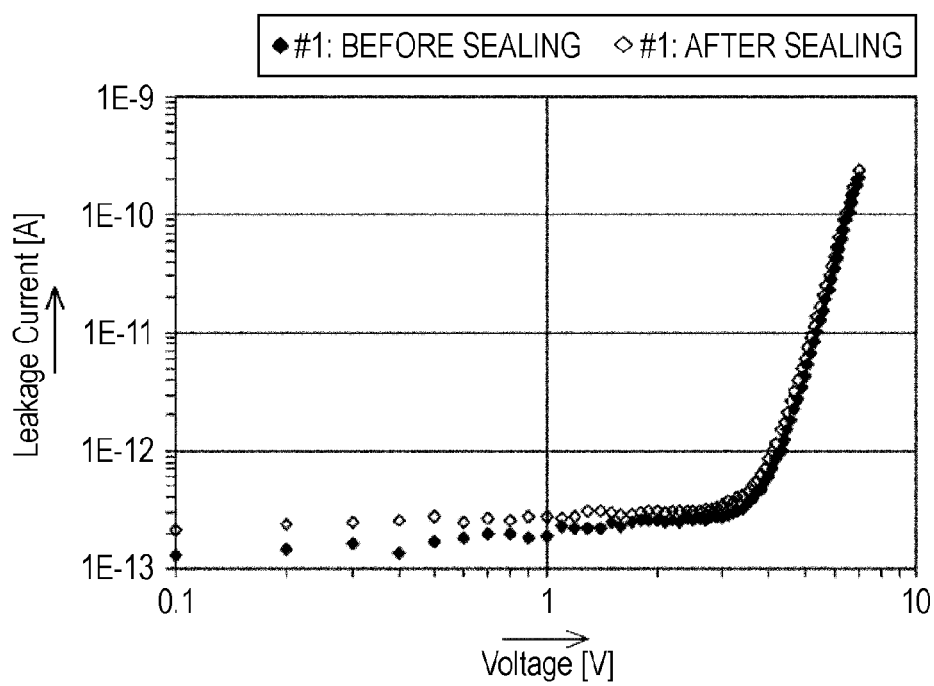
FIGS. 11A to 11C are graphs showing I-V characteristics of a capacitor device according to Example 1 of the present invention before and after sealing.
Figure 11B:
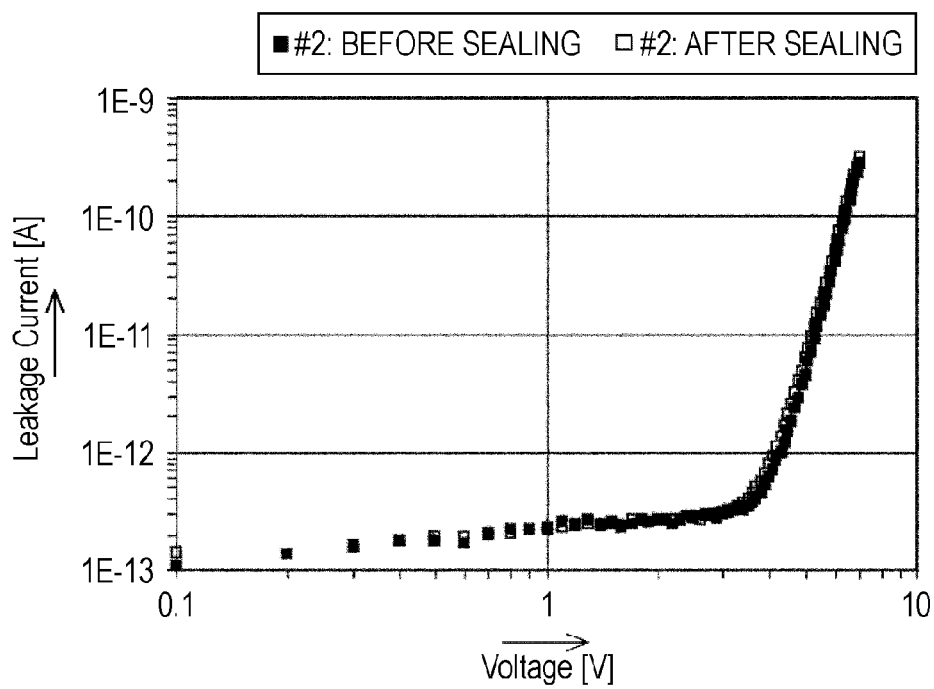
Figure 11C:
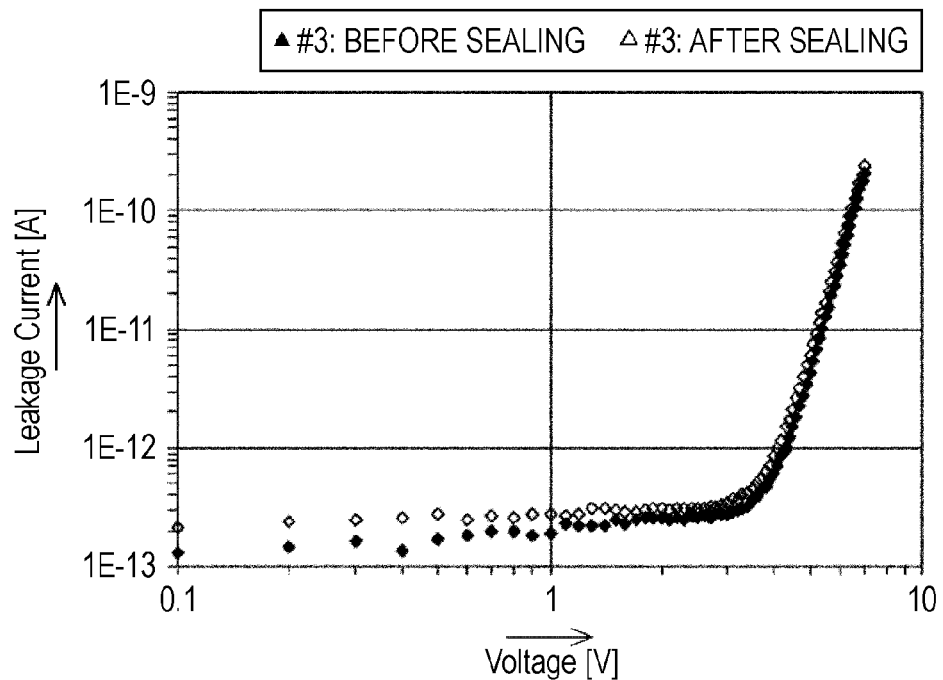

FIGS. 11A to 11C show graphs of I-V characteristics of the capacitor device of the present invention sealed in an air atmosphere. The horizontal axis indicates voltage (unit: V) and the vertical axis indicates the leakage current (unit: A). FIGS. 11A and 11C respectively show characteristics of three samples #1 to #3 before and after sealing.

As shown in FIGS. 11A to 11C, the I-V characteristics of the capacitor devices did not deteriorate before and after sealing when the capacitor devices were sealed in air as in Examples of the present invention.

Figure 12:
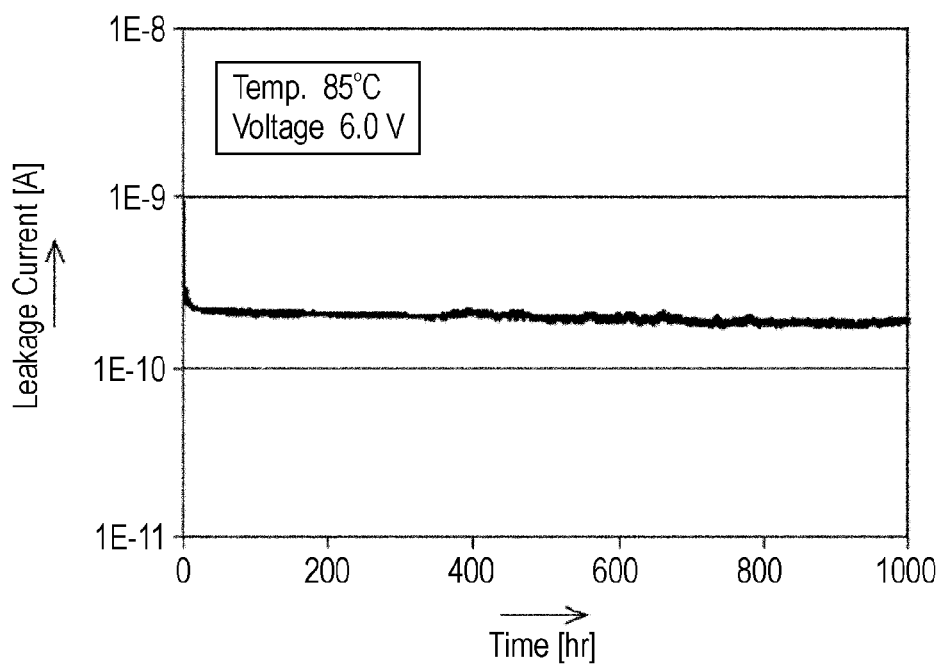
FIG. 12 is a diagram showing changes in leakage current of the capacitor device according to Example 1 of the present invention with time.

Changes in leakage current of the sample of Example 1 with time were measured by applying 6.0 V at 85° C. The results are shown in FIG. 12. As obvious from FIG. 12, it was confirmed that, with the sample of this Example, the current value of the leakage current did not substantially change with time, a low current value was maintained, and high reliability was achieved.

A capacitor device including a capacitor element 21 coated with SiO2 serving as an insulating protective film and a dielectric layer 4 having no exposed part 23 was prepared as Comparative Example. Through holes exposing only part of the upper electrode 5 and the lower electrode 2 were formed in the SiO2 film of each electrode to conduct electrical measurement and the dielectric layer 4 had no exposed part 23. FIG. 13 shows the I-V characteristics of Example and Comparative Example. As obvious from the graph, the leakage current of Comparative Example was generally larger than that of Example of the present invention. This confirmed that providing the exposed part 23 exposed in the space 22 to the dielectric layer 4 to avoid application of stresses to the dielectric layer 4 from an insulating protective film or the like is effective.

Next, samples with different atmospheres in the spaces were prepared and their leak current characteristics before and after sealing were measured. In particular, a nitrogen-sealed sample, i.e., Example 2, and a vacuum-sealed sample, i.e., Example 3, were respectively prepared by seam welding in a nitrogen atmosphere and in vacuum.

Figure 14:
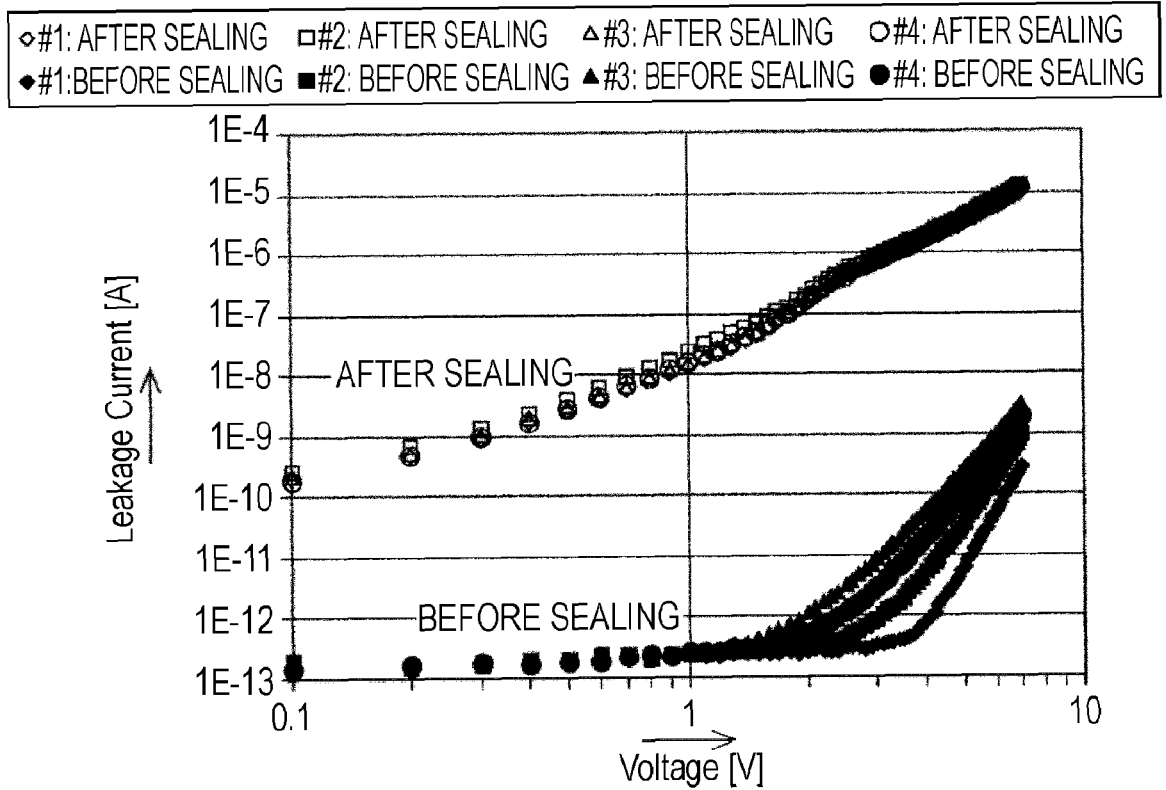
FIG. 14 is a graph showing I-V characteristics of a capacitor device of Example 2 of the present invention before and after sealing.

The leakage current characteristic of nitrogen-sealed Example 2 is shown in FIG. 14. As shown in FIG. 14, it was confirmed that the sample sealed with nitrogen had a better leakage current characteristic than Comparative Example shown in FIG. 13 before sealing. However, the I-V characteristic of the capacitor device significantly deteriorated after sealing. This is presumably attributable to equilibrium reactions between oxygen in the dielectric layer 4 and nitrogen-sealed atmosphere and new oxygen vacancies generated thereby in the dielectric layer 4.

Figure 15:
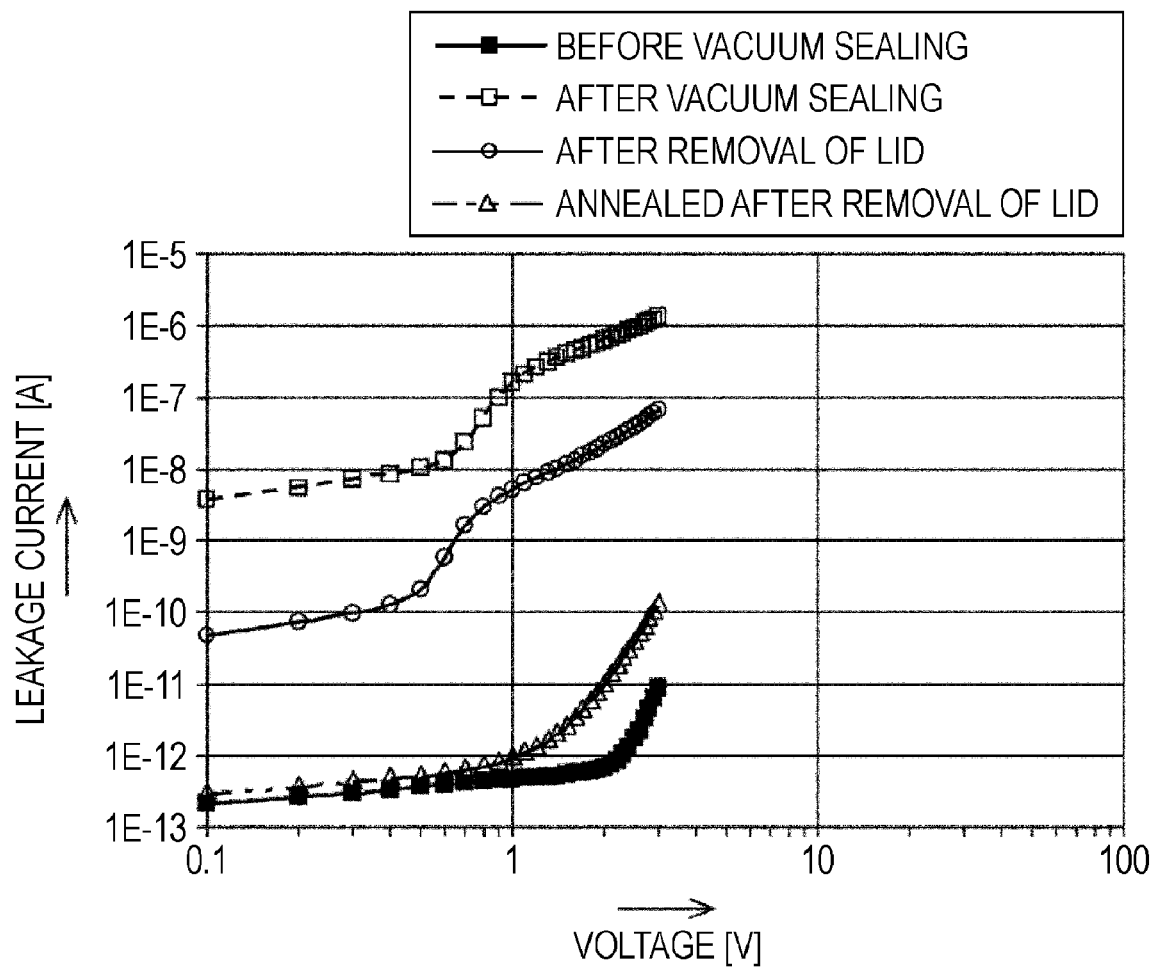
FIG. 15 is a graph showing I-V characteristics of a capacitor device of Example 3 of the present invention before and after sealing.

FIG. 15 shows the leakage current characteristic of Example 3, which was vacuum-sealed. As shown in FIG. 15, the vacuum-sealed sample exhibited a better leakage current characteristic than Comparative Example shown in FIG. 13 before sealing. However, the I-V characteristic significantly deteriorated after sealing. This is presumably attributable to equilibrium reactions between oxygen in the dielectric layer 4 and vacuum-sealed atmosphere and new oxygen vacancies generated thereby in the dielectric layer 4. The leakage current characteristic measured after vacuum sealing and removal of the cover (lid) 25 showed slight improvements. However, compared to the leakage current characteristic before the sealing, significant deterioration was still observed. After removal of the cover (lid) 25, the whole supporting substrate 1 was annealed at 500° C. for 1 hour in air. As a result, the I-V characteristic notably improved, and the characteristic nearly as good as before sealing was obtained. However, although the leakage current characteristic comparable to that before vacuum sealing was obtained in a low-voltage region, the voltage at which the current rose was low and did not completely return to the level before the vacuum sealing. Since the I-V characteristic deteriorated after sealing even when the sample was vacuum sealed, it can be assumed that the crucial factor for the changes in I-V characteristic is not the reducing elements in the atmosphere such as hydrogen but is the presence of oxygen. Once the dielectric layer 4 is deteriorated, the leakage current characteristic remains deteriorated even when the sample was returned to an oxygen-containing atmosphere. Thus, it was found to be important not to use a sacrificial layer or the like in sealing the capacitor element 21.

The capacitor device of Comparative Example exhibited a larger leakage current after sealing than in the cases of Examples 2 and 3.

In sum, it was found that a capacitor device having good leakage current characteristic can be obtained by employing a structure in which stresses by an insulating protective film or the like are not applied to the dielectric layer 4 and by allowing the dielectric layer 4 to have the exposed part 23 exposed to the space 22. Moreover, it was found that, since the interior of the space 22 was sealed in air, a certain amount of oxygen was present in the atmosphere and thus the dielectric layer 4 remained unreduced. As a result, a capacitor device in which the leakage current is low and remains low over time and which has stable quality can be provided.

Figure 16A:
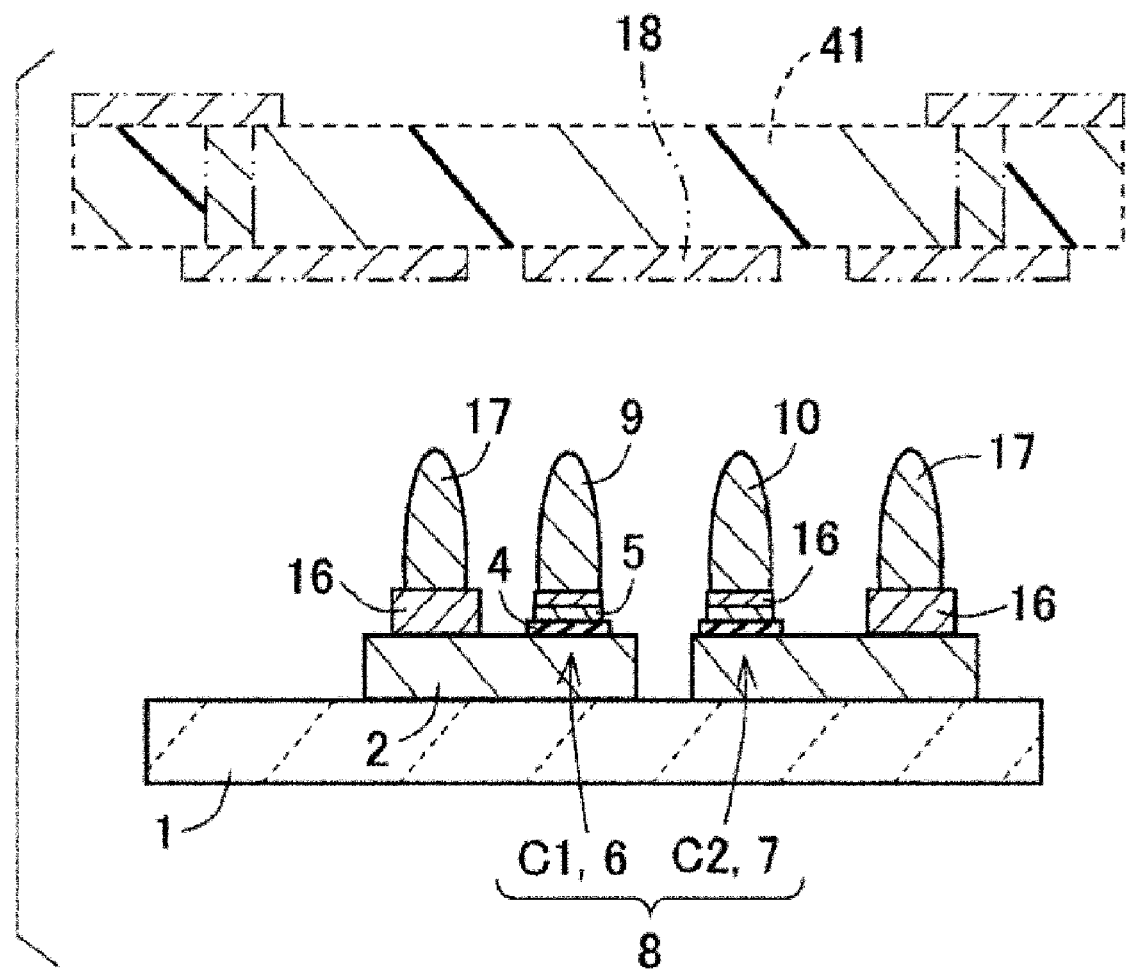
FIGS. 16A and 16B are cross-sectional views showing a capacitor according to a first embodiment of the present invention.

FIG. 16A is a cross-sectional view showing a capacitor according to a first embodiment of the present invention.

The capacitor of the present invention is connected to an external circuit and used. For example, the capacitor is mounted onto the circuit substrate 41 (indicated by dotted lines in the drawing, detailed description of which is omitted here but provided hereinafter) having conductors such as wiring patterns 18 or the like and used. The capacitor includes a capacitor element group 8 on the supporting substrate 1, the capacitor element group 8 including a capacitor element C1 and a capacitor element C2 each including the lower electrode 2, the dielectric layer 4, and the upper electrode 5 sequentially stacked in the thickness direction. The region where the lower electrode 2, the dielectric layer 4, and the upper electrode 5 overlap one another is referred to as "capacitance-forming portion". The capacitor element group 8 includes the capacitor element C1 and the capacitor element C2 which respectively function as a first capacitor element 6 and a second capacitor element 7. The upper electrode 5 of the first capacitor element 6 is connected to a first connector 9 via the solder diffusion-preventing layer 16, and the upper electrode 5 of the second capacitor element 7 is connected to a second connector 10 via the solder diffusion-preventing layer 16. The first connector 9 and the second connector 10 are connected to the wiring pattern 18 on the circuit substrate 41 to connect the first capacitor element 6 and the second capacitor element 7 in series. In other words, the wiring pattern 18 is connected to both the first connector and the second connector 10, and thus the upper electrodes 5 are connected to each other. The dielectric layers 4 of the first capacitor element 6 and the second capacitor element 7 have exposed parts.

The lower electrodes 2 of the first capacitor element 6 and the second capacitor element 7 extend beyond the capacitance-forming portion on the supporting substrate 1 to be connected to the input/output terminals of the capacitor. The solder diffusion-preventing layer 16 and a terminal connector 17 are sequentially laminated on each of the extended portions to form the input/output terminals. The input/output terminals are connected to the wiring patterns 18 on the circuit substrate 41 for the input/output terminals to prepare a capacitor including the capacitor element C1 and the capacitor element C2 connected in series between the input terminal and the output terminal.

According to this structure, the capacitor elements can be connected to one another without covering them with an interlayer insulating film or a protective film as in the related art. Since stresses from the interlayer insulating film or the protective film do not work on the dielectric layer 4, deterioration of characteristics such as leakage current characteristic of the capacitor can be reduced.

A dielectric layer having a dielectric constant that varies under application of voltage may be used and bias voltage may be applied to change the capacitance of each capacitor element so that the capacitor functions as a variable capacitor. This equally applies to the embodiments of the capacitor described below. The method of applying the bias voltage is explained in the description of the capacitor device below.

Figure 16B:
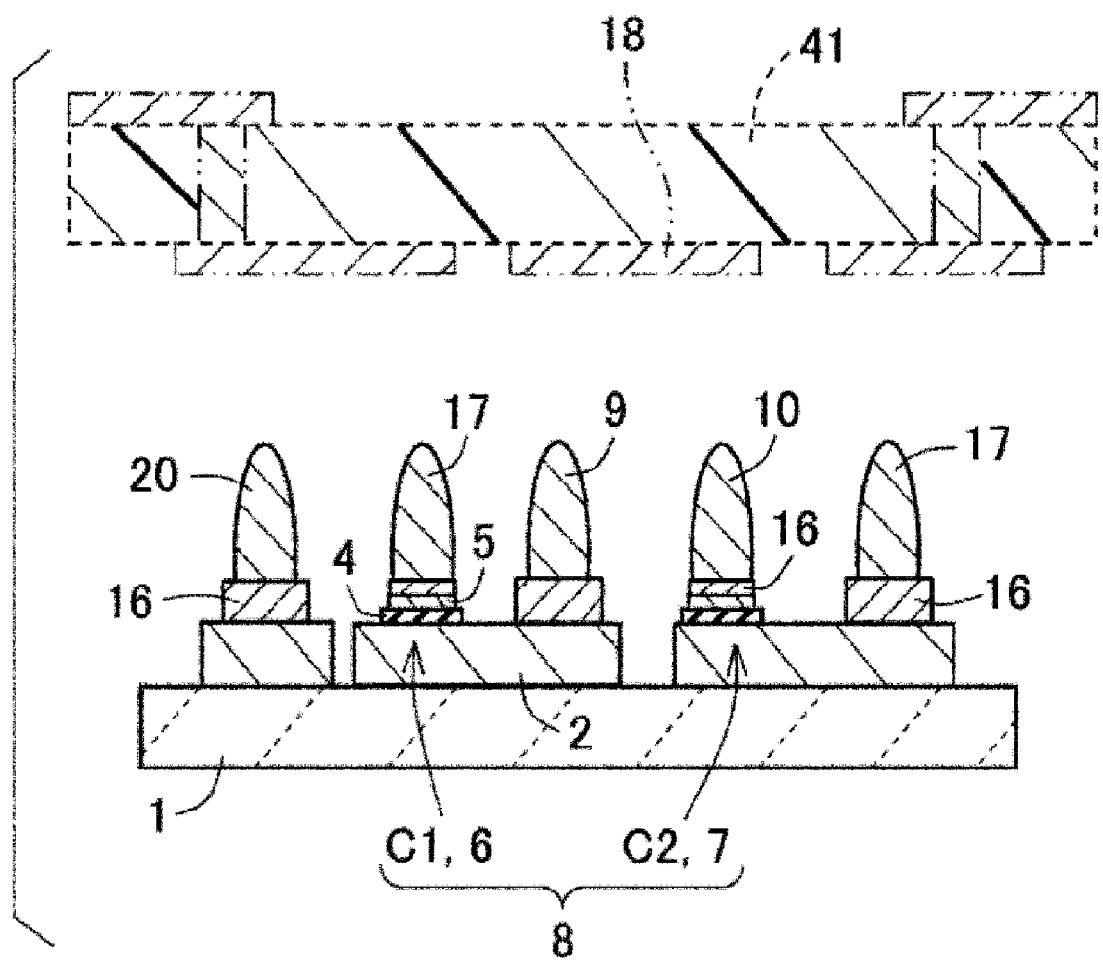

FIG. 16B is a cross-sectional view of a modification of the capacitor shown in FIG. 16A.

The capacitor shown in FIG. 16B differs from that shown in FIG. 16A in that the first connector 9 is formed on the extended portion of the lower electrode 2 of the capacitor element C1 beyond the capacitance-forming portion, with the solder diffusion-preventing layer 16 between the lower electrode 2 and the first connector 9. When the first connector 9 is connected to the second connector 10 on the upper electrode 5 of the capacitor element C2 via the wiring pattern 18 on the circuit substrate 41, the capacitor element C1 and the capacitor element C2 are connected in series.

According to this structure, the input/output terminals of the capacitor are connected to the upper electrode 5 of the capacitor element C1 and the lower electrode 2 of the capacitor element C2, respectively. Thus, the terminal connector 17 is provided on the upper electrode 5 of the capacitor element C1.

A connecting conductor 20 may be provided to improve the connecting strength between the circuit substrate 41 and the capacitor. The connecting conductor 20 is preferably formed on the solder diffusion-preventing layer 16 on the lower electrode 2 on the supporting substrate 1 so that the connecting conductor 20 is at the same height as the first connector 9, the second connector 10, and the terminal connector 17.

Figure 17:
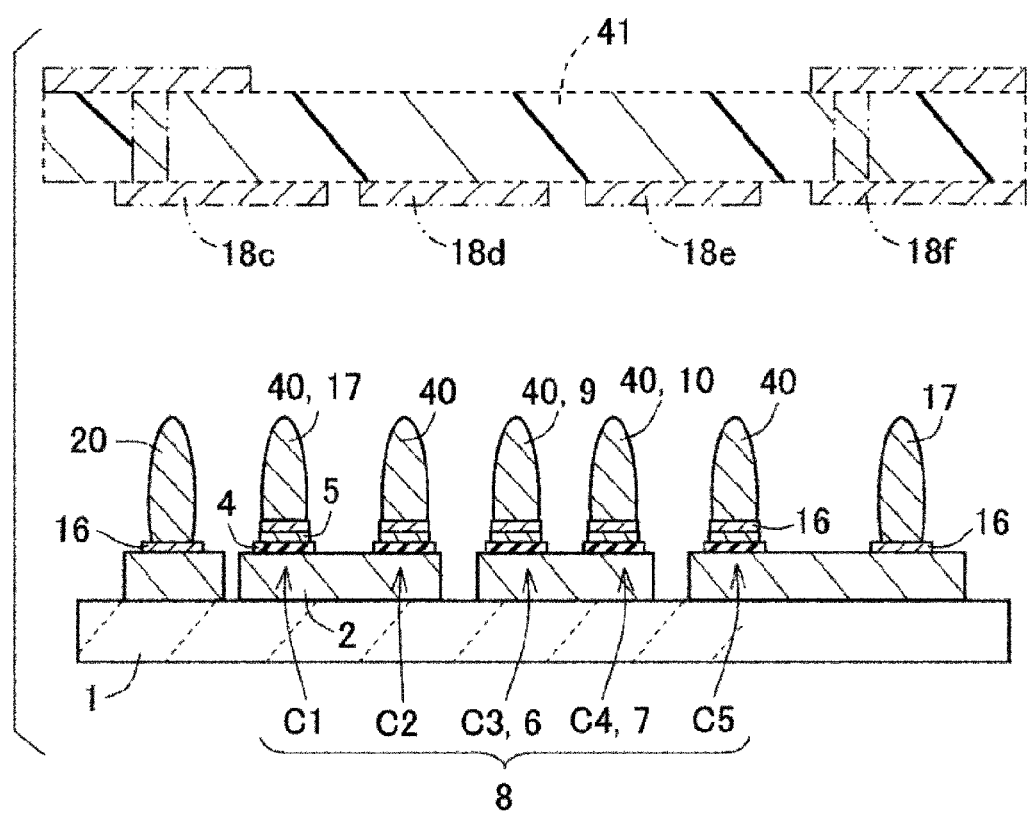
FIG. 17 is a cross-sectional view of a capacitor according to a second embodiment of the present invention.

FIG. 17 is a cross-sectional view of a capacitor according to a second embodiment of the present invention.

The capacitor shown in FIG. 17 includes a plurality of capacitor elements C1 to C5. The capacitor elements C1 and C2 share a lower electrode 2, and the capacitor elements C3 and C4 share a lower electrode 2. A connecting body 40 is disposed on each of the upper electrodes 5 of the capacitor elements C1 to C5.

The capacitor elements C1 to C5 can be connected to one another in series by connecting the capacitor to the circuit substrate 41 that includes a first wiring pattern 18c connected to the upper electrode 5 of the capacitor element C1, a second wiring pattern 18d for connecting the upper electrodes 5 of the capacitor element C2 and the capacitor element C3 to each other, a third wiring pattern 18e for connecting the upper electrodes 5 of the capacitor element C4 and the capacitor element C5 to each other, and a fourth wiring pattern 18f connected to the input/output terminal connector 17 connected to the lower electrode 2 of the capacitor element C5.

The capacitor element C3 and the capacitor element C4 are focused and described here.

The capacitor element C3 is electrically connected to the capacitor element C4 by sharing the lower electrode 2. As a result, a process of connecting ends of the capacitor elements C3 and C4 can be omitted, the manufacturing process can be simplified, and the productivity can be improved.

When the connector 40 on the upper electrode 5 of the capacitor element C3 and the connector 40 on the upper electrode 5 of the capacitor element C4 are respectively connected to separate wiring patterns (the second wiring pattern 18d and the third wiring pattern 18e) on the circuit substrate 41, a series connection is established between the capacitor element C3 and the capacitor element C4 because the second wiring pattern 18d is connected to the capacitor element C3 through the connector 40, the capacitor element C3 is connected to the capacitor element C4 by sharing the lower electrode 2, and the capacitor element C4 is connected to the third wiring pattern 18e through the connector 40.

The capacitor element C3 and the capacitor element C4 can be considered to be the first capacitor element 6 and the second capacitor element 7, and each connector 40 can be considered to be the first connector 9 or the second connector 10. Note that the functions of the first connector 9 and the second connector 10 are not limited to establishing a series connection between the first capacitor element 6 and the second capacitor element 7 as shown in FIG. 16A and may include connecting the first capacitor element 6 and the second capacitor element 7 to the circuit substrate 41 in series to operate as a capacitor.

Each of the capacitors shown in FIGS. 16A, 16B, and 17 may be formed by stacking the layers that will form the lower electrode 2, the dielectric layer 4, and the upper electrode 5 on the supporting substrate 1 and then sequentially patterning the layers from the top to the bottom. Thus, the productivity can be enhanced, capacitors can be formed in the same batch, and deposition of foreign matter or the like can be prevented between layers. Thus, the reliability can be enhanced.

Figure 18A:
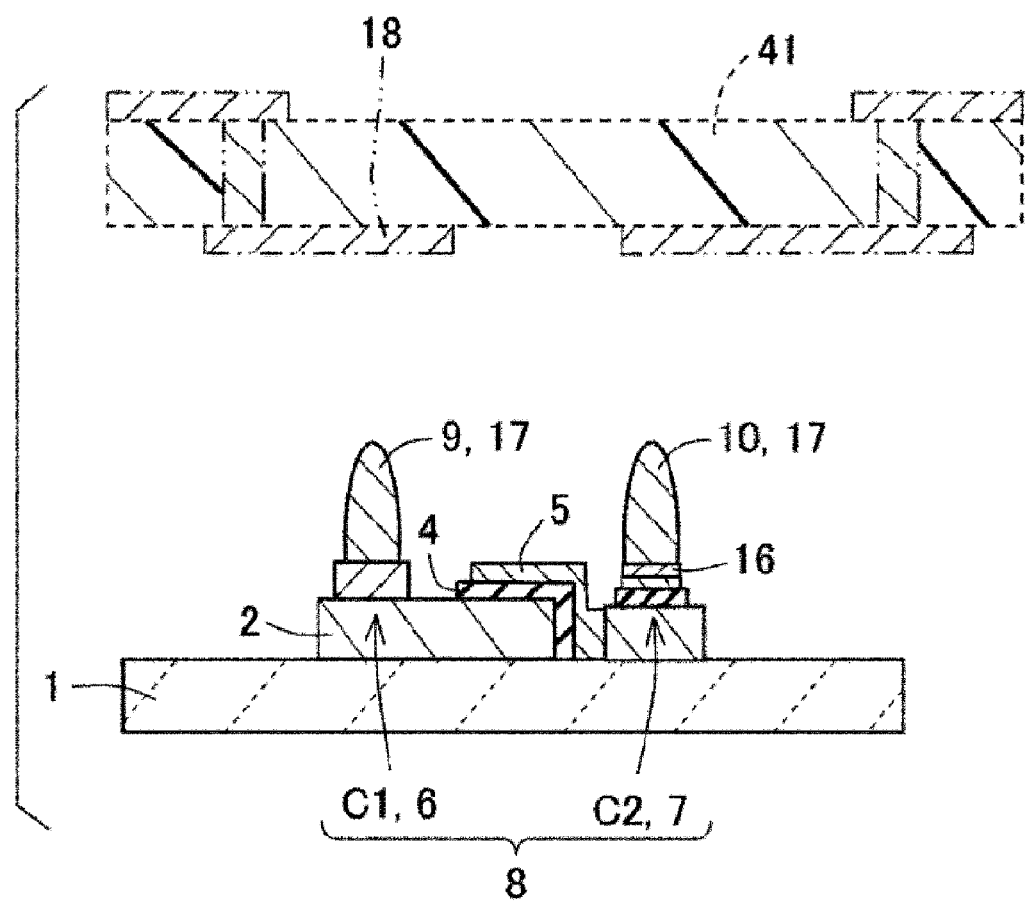
FIGS. 18A and 18B are cross-sectional views of capacitors according to a third embodiment of the present invention.

FIG. 18A is a cross-sectional view of a capacitor according to a third embodiment of the present invention.

The capacitor shown in FIG. 18A includes the capacitor element C1 serving as the first capacitor element 6 and the capacitor element C2 serving as the second capacitor element 7 on the supporting substrate 1, and the upper electrode 5 of the capacitor element C1 is electrically connected to the lower electrode 2 of the capacitor element C2.

The first connector 9 is disposed on the upper surface of the extended portion of the lower electrode 2 of the capacitor element C1 beyond the capacitance-forming portion, and the second connector 10 is disposed on the upper surface of the upper electrode 5 of the capacitor element C2. The first connector 9 and the second connector 10 each have a function of the terminal connector 17. When the first connector 9 and the second connector 10 are respectively connected to separated wiring patterns 18 on a wiring substrate, a series connection is established between the capacitor element C1 and the capacitor element C2 and a capacitor is thereby formed.

According to this structure, a process of connecting ends of the plurality of capacitor elements to each other can be omitted, and a capacitor can be produced at high efficiency. When the dielectric layer 4 is configured to undergo changes in response to application of voltage and when bias voltage is applied between the connecting points of the first capacitor element 6 and the second capacitor element 7 and the lower electrode 2 of the first capacitor element 6 and the upper electrode of the second capacitor element 7, the direction of flow of leakage current becomes opposite in the thickness direction between the first capacitor element 6 and the second capacitor element 7. Thus, when the first capacitor element 6 and the second capacitor element 7 are considered as a whole, the dependency of the leakage current on the polarity can be decreased.

Figure 18B:
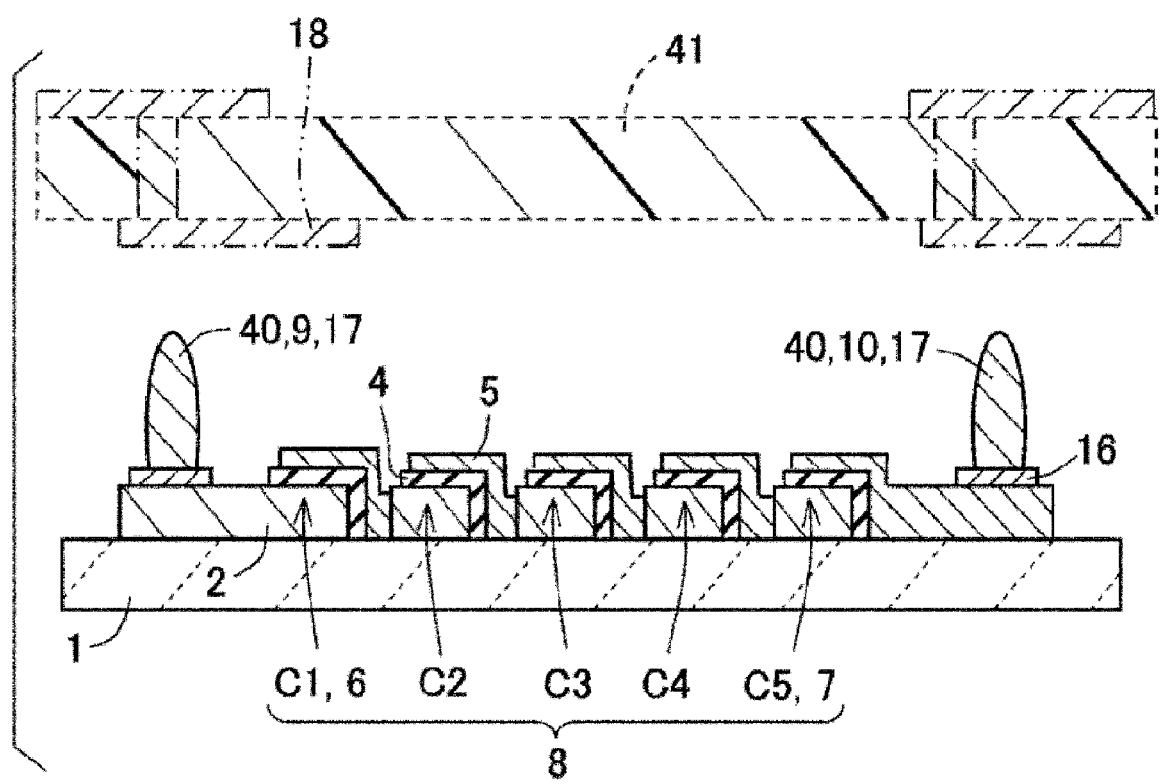

FIG. 18B is a cross-sectional view showing a modification of the capacitor shown in FIG. 18A.

The capacitor shown in FIG. 18B differs from the capacitor shown in FIG. 18A in that five capacitor elements, C1 to C5 are formed on the supporting substrate 1. Regarding the capacitor elements C1 to C5, the upper electrode 5 of one of the adjacent two capacitor elements is connected to the lower electrode 2 of the other capacitor element to establish a series connection in the direction of arrangement. A connector 40 is disposed on the upper surface of the extended portion of the lower electrode 2 of the capacitor element C1 beyond the capacitance-forming portion and another connector 40 is disposed on the upper surface of the upper electrode 5 of the capacitor element C5. These connectors 40 also serve as terminal connectors.

Suppose the capacitor element C1 serves as the first capacitor element 6 and the capacitor element C2 serves as the second capacitor element 7. Then the connector 40 connected to the first capacitor element 6 serves as the first connector 9 and the connector 40 connected to the second capacitor element 7 serves as the second connector 10. Because of the first connector 9 and the second connector 10, the first capacitor element 6 (C1) and the second capacitor element 7 (C2) can be connected to the circuit substrate 41 and function as capacitors while a series connection is established among the capacitor elements C1 to C5.

According to this structure, the process of connecting the ends of the capacitor elements can be omitted. Moreover, since the number of the connectors 40 needed is as small as two, the production efficiency of the capacity can be enhanced.

Next, a capacitor device including the capacitor of the present invention connected to the circuit substrate 41 is described.

Figure 19:
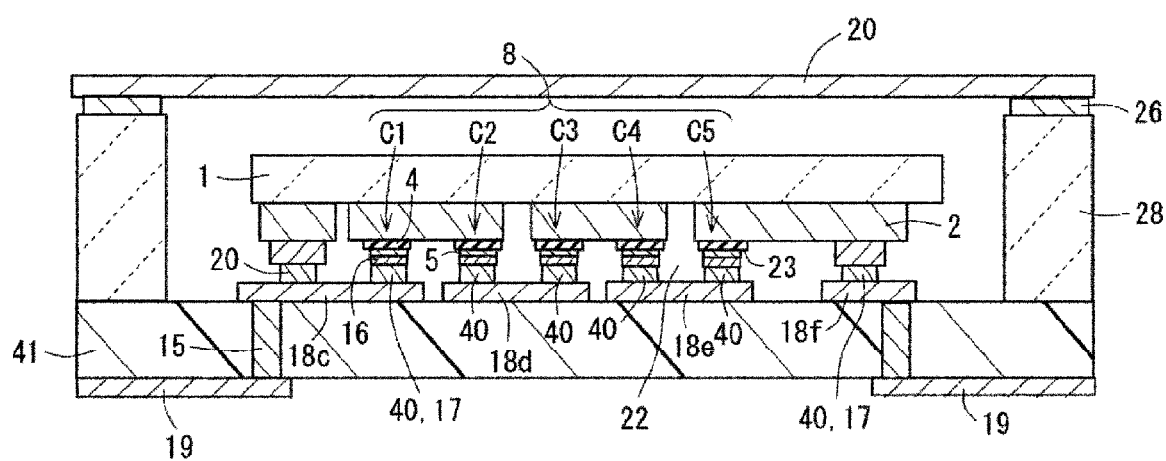
FIG. 19 is a cross-sectional view of a capacitor device according to a fifth embodiment of the present invention.

FIG. 19 is a cross-sectional view of a capacitor device according to a fifth embodiment of the present invention. The capacitor device includes the capacitor of the present invention shown in FIG. 17, the circuit substrate 41 on which conductors are provided and the capacitor shown in FIG. 17 is mounted, and a sealant that seals the capacitor element group 8 including the capacitor elements C1 to C5 through the space 22. Each of the dielectric layers 4 of the capacitor elements have the exposed part 23 exposed in the space 22. In the example shown in FIG. 19, an example in which the wiring patterns 18 are used as the conductors is described. The wiring patterns 18 of the circuit substrate 41 are respectively connected to the connectors 40 to connect the capacitor elements C1 to C5 in series. Here, the combination of the first capacitor element 6 and the second capacitor element 7 may be any combination of adjacent capacitor elements. Examples of the combination include the combination of the capacitor element C1 and the capacitor element C2, the combination of the capacitor element C3 and the capacitor element C4, the combination of the capacitor element C2 and the capacitor element C3, and the combination of the capacitor element C4 and the capacitor element C5. The wiring patterns 18 include a wiring pattern 18c that connects the capacitor element C1 to an external connecting terminal 19a, a wiring pattern 18d that connects the capacitor element C2 to the capacitor element C3, a wiring pattern 18e that connects the capacitor element C4 to the capacitor element C5, and a wiring pattern 18f that connects the capacitor element C5 to an external connecting terminal 19b. Among these, the wiring patterns 18c and 18f also function as terminal connecting electrodes that are connected to the external connecting terminals 19a and 19b. Penetrating conductors 15 connect the wiring patterns 18c and 18f to the external connecting terminals 19a and 19b, respectively. The external connecting terminals 19 are disposed on the main surface of the circuit substrate 41 opposite the surface on which the wiring patterns 18 are formed.

According to this structure, a plurality of capacitor elements can be connected in series without providing a protective film or an interlayer insulating film to the capacitor, and thus, an interlayer insulating film or protective film that applies stresses on the dielectric layer 4 is not necessary. Thus, deterioration of characteristics such as a leakage current characteristic of the capacitor can be reduced. Since the capacitor elements C1 to C5 are connected in series in terms of high frequency, the high frequency voltage applied to the capacitor elements is divided among the capacitor elements. Thus, the high frequency voltage applied to each capacitor element is low due to voltage division. As a result, the fluctuation of capacitance in response to the high frequency signals from the capacitor device can be reduced. Moreover, since the capacitor elements C1 to C5 are connected in series in terms of high frequency, the same effect as increasing the thickness of the dielectric layer of the capacitor element can be achieved, and the calorific value per unit volume caused by insertion loss of the capacitor device can be decreased. Thus, the power durability of the capacitor device can be enhanced.

The sealant has a structure in which a ceramic frame 28 surrounding the region where the capacitor is connected is formed on the circuit substrate 41 and a cover 25 is connected to the upper surface of the frame 28 with a seal ring 26. The frame 28 may be connected to the cover 25 with the seal ring 26 by seam welding or by using a Au—Sn alloy solder or resin as the material for the seal ring 26.

The circuit substrate 41 and the frame 28 form a package for housing the capacitor. Gas containing oxygen is introduced into the space 22.

According to this structure, the same effects as those achieved by the capacitor device of the first embodiment of the present invention can be achieved.

Figure 20:
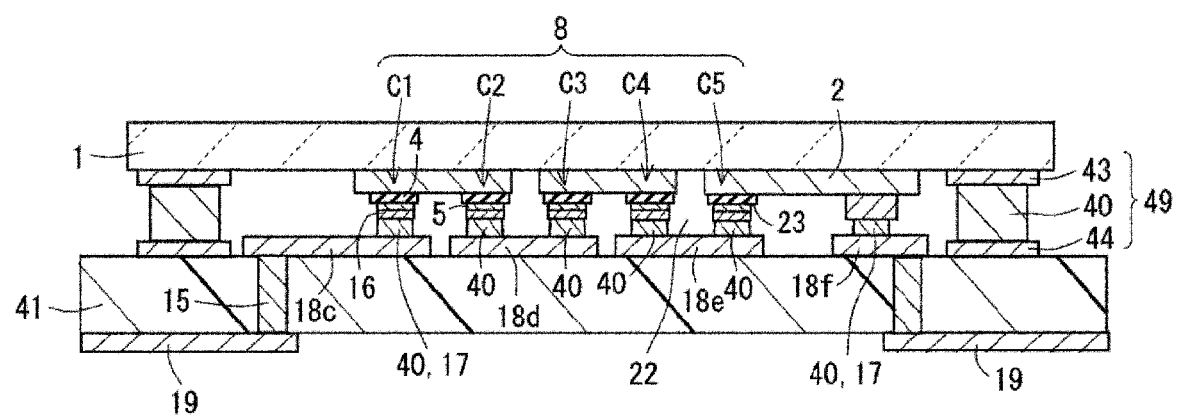
FIG. 20 is a cross-sectional view of a capacitor device according to a sixth embodiment of the present invention.

FIG. 20 is a cross-sectional view showing a capacitor device according to a sixth embodiment of the present invention.

The capacitor device shown in FIG. 20 differs from that shown in FIG. 19 in the structure of the sealant. The sealant shown in FIG. 20 includes the circuit substrate 41 and the annular member 49 that surrounds the region where the capacitor element group 8 is formed and joins the circuit substrate 41 to the supporting substrate 1 for sealing. The annular member 49 includes the annular electrode layer 43 and the annular pad portion 44, and the connectors 40 connecting the annular electrode layer 43 to the annular pad portion 44. The connectors 40 constituting the annular member 49 are connected to the supporting substrate 1 through the annular electrode layer 43 surrounding the region where the capacitor element group 8 is formed on the supporting substrate 1 and are connected to the circuit substrate 41 through the annular pad portion 44 on the circuit substrate 41 arranged to align with the annular electrode layer 43.

According to this structure, the capacitor can be sealed by a relatively simple structure and the package is thus not necessary. A small, low-height capacitor device can be achieved. When the annular member 49 is composed of an inorganic material or a metal material, the capacitor can be hermetically sealed and a capacitor device with higher reliability and stability can be provided.

The surface (rear surface) of the supporting substrate 1 not facing the circuit substrate 41, side surfaces of the supporting substrate 1, and the annular member 49 may be sealed with sealing resin.

Figure 21:
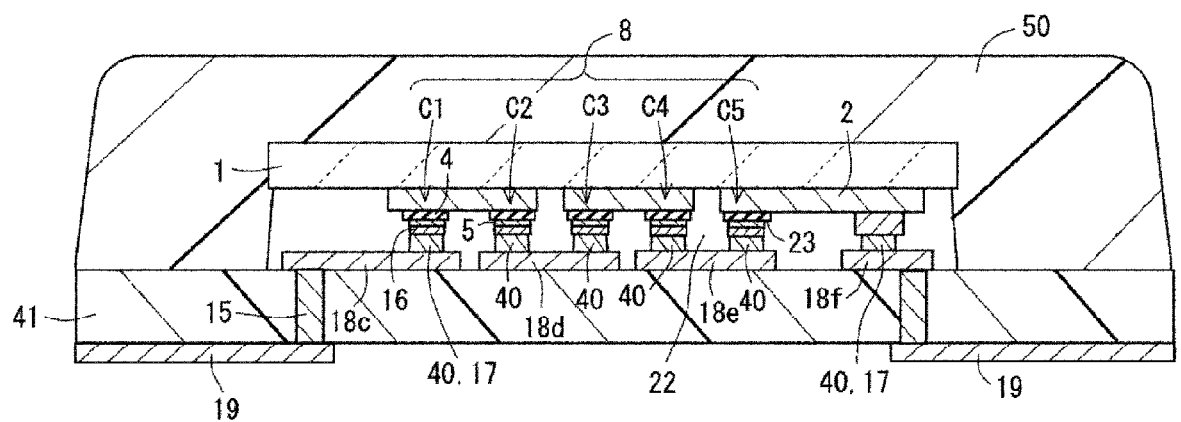
FIG. 21 is a cross-sectional view of a capacitor device according to a seventh embodiment of the present invention.

FIG. 21 is a cross-sectional view of a capacitor device according to a seventh embodiment of the present invention.

The capacitor device shown in FIG. 21 differs from that shown in FIG. 19 in the structure of the sealant. In particular, the sealant shown in FIG. 21 includes a resin member 50 that coats a main surface of the circuit substrate 41 to which the capacitor is connected, side surfaces of the supporting substrate 1, and a main surface of the supporting substrate 1 not facing the circuit substrate 41. The resin member 50 prevents entry of moisture into the enclosed space and increases the mechanical strength of the capacitor device. The resin member 50 may be composed of a thermosetting resin such as epoxy resin or polyimide resin, a thermoplastic resin such as polyphenylene sulfide resin, a UV-curable resin, or a low melting point glass and may be formed by applying any of these materials by potting or printing and then subjecting the applied material to a curing treatment. For example, in order to use a resin member 50 composed of epoxy resin, the epoxy resin may be applied by potting to cover the capacitor connected to the circuit substrate 41 and heated in a drying furnace at 150° C. for 5 minutes to be cured.

Since the side surfaces of the supporting substrate 1 and the main surface of the supporting substrate 1 not facing the circuit substrate 41 are coated with the resin member 50, the structure is simple. The step of sealing the capacitor element group 8 can be simplified, and the capacitor device can be manufactured at high productivity. Since no package or like component is needed to seal the capacitor element group 8, a small, low-height capacitor device can be achieved.

Figure 22:
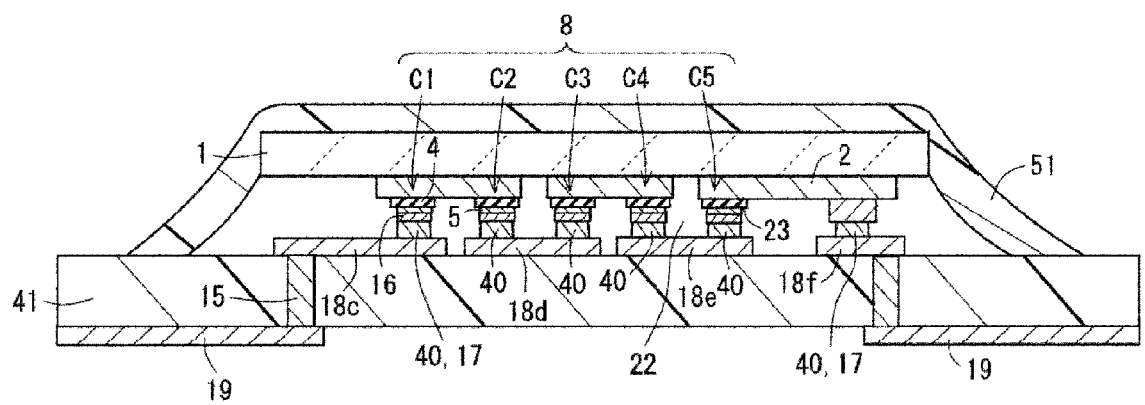
FIG. 22 is a cross-sectional view of a capacitor device according to an eighth embodiment of the present invention.

FIG. 22 is a cross-sectional view of a capacitor device according to an eighth embodiment of the present invention.

The capacitor device shown in FIG. 22 differs from the structure shown in FIG. 21 in the structure of the sealant. In particular, whereas the sealant shown in FIG. 21 is the resin member 50 formed by potting or the like, the sealant shown in FIG. 22 includes a sheet-shaped resin member 51.

The sheet-shaped resin member 51 covers throughout the upper surface of the circuit substrate 41, side surfaces of the supporting substrate 1, and a main surface (rear surface) of the supporting substrate 1 not facing the circuit substrate 41.

The sheet-shaped resin member 51 is composed of epoxy resin, phenol resin, or the like. The sheet-shaped resin member 51 is formed by placing a sheet-shaped uncured resin over the supporting substrate 1, pressing the sheet-shaped uncured resin from above to attach the resin onto the rear surface of the supporting substrate 1 and the upper surface of the circuit substrate 41, and curing the resin by heating. The heating temperature differs depending on the resin used. For example, when the sheet-shaped resin member 51 composed of epoxy resin is used, the resin should be treated at 150° C.

According to this structure, the capacitor element group 8 can be sealed with a simple structure, production steps can be simplified, and a capacitor device can be manufactured at high productivity. Since a package for sealing the capacitor element group 8 is not needed and only the sheet-shaped resin member 51 is needed to seal the capacitor, a small, low-height capacitor can be achieved.

According to the capacitor device of the present invention, in sealing the capacitor element group 8 with the sealant, it is preferable to introduce gas containing oxygen, such as dry air, into the space 22 for the same reasons described above in the embodiments.

It should be noted that in the capacitor devices shown in FIGS. 19 to 22, the wiring patterns 18 are used as the conductors. However, the conductors are not limited to the wiring patterns 18. For example, the connector 40 may be connected to vias in the circuit substrate 41 and the wires in the circuit substrate 41 may be drawn to electrically connect the first capacitor element to the second capacitor element.

The capacitor devices described above may have a function of a variable capacitor device by using a dielectric layer having a dielectric constant variable in response to application of voltage. In such a case, the bias voltage may be superimposed on the high frequency signals and applied between the external connecting terminals 19a and 19b. Alternatively, in order to increase the capacitance tuning ratio of the capacitor device, bias lines for separately applying bias voltages to the individual capacitor elements may be provided as shown in FIGS. 5 to 9.

Examples of the capacitors having a leak current characteristic that does not significantly change by reversing the polarity of the bias voltage are the structures shown in FIGS. 16B and 18B. This is because the direction in which the leakage current flows by application of the bias voltage is opposite in the thickness direction between the capacitor elements and thus the polarity of the leakage currents is cancelled.

Next, an electronic component of the present invention including the capacitor device described above is described.

Figure 23:
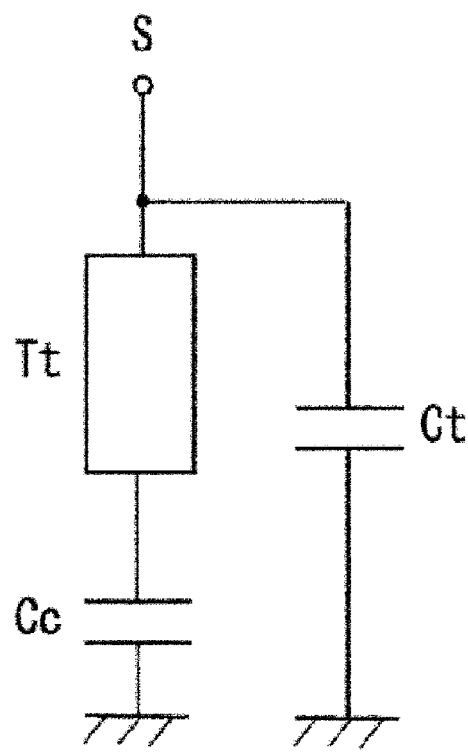
FIG. 23 is an equivalent circuit diagram of an electronic component according to one embodiment of the present invention.

FIG. 23 is an equivalent circuit diagram of an electronic component according to one embodiment of the present invention. In the equivalent circuit diagram shown in FIG. 23, reference symbol Ct denotes a capacitor device of the present invention, Tt denotes a $\lambda g/4$ transmission line that serves as a transmission line, Cc denotes a high frequency ground capacitor that forms a high frequency grounding capacitance, and S denotes a signal input terminal. Here, $\lambda g$ represents an effective wavelength at which a high frequency signal input from the signal input terminal S is transmitted in the $\lambda g/4$ variable transmission line Tt.

In FIG. 23, between the signal input terminal S and the reference potential portion, the capacitor device Ct is connected in parallel to a circuit in which the transmission line Tt and the high frequency ground capacitor Cc are connected in series. The reference potential portion here is a ground potential.

According to this structure, an electronic component that forms a resonant circuit having a desired resonance characteristic can be provided. Since the capacitor device Ct of the present invention is used, the electronic component can achieve high reliability. When the capacitor device Ct has a function of a variable capacitor, the resonance frequency can be changed to a desired value.

Next, a filter device of the present invention is described.

Figure 24:
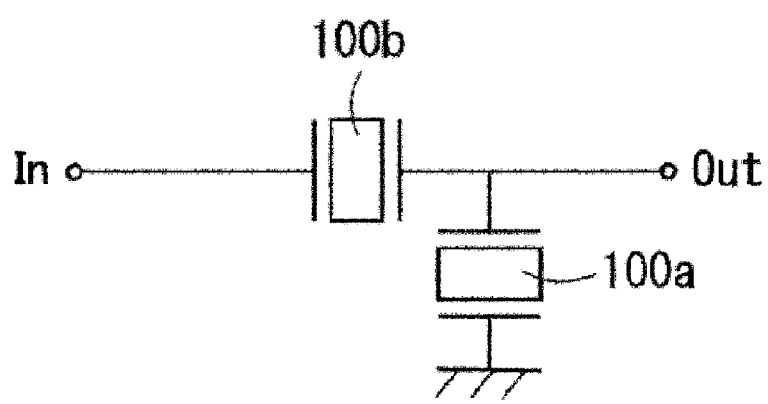
FIG. 24 is an equivalent circuit diagram of a filter device according to one embodiment of the present invention.

FIG. 24 is an equivalent circuit diagram showing a filter device according to one embodiment of the present invention.

As shown in FIG. 24, in the filter device of the present invention, electronic components 100a and 100b of the present invention are respectively connected to a point between the reference potential terminal and the input/output line interconnecting an input terminal In and an output terminal Out and to a point on the input/output line. In this example, the reference potential terminal is grounded.

Alternatively, only the electronic component 100a of the present invention may be connected to a point between the reference potential terminal and the input/output line interconnecting the input terminal In and the output terminal Out, or only the electronic component 100b may be connected to a point on the input/output line.

In view of the above, a ladder-type filter device or a balance-type filter device such as an unbalanced input/balanced output filter may be formed.

According to the filter device of the present invention having this structure, since the electronic components 100a and 100b of the present invention are used as resonators of the filter, a highly reliable device can be provided.

An example of forming a communication apparatus using a filter device of the present invention will now be described.

Figure 25:
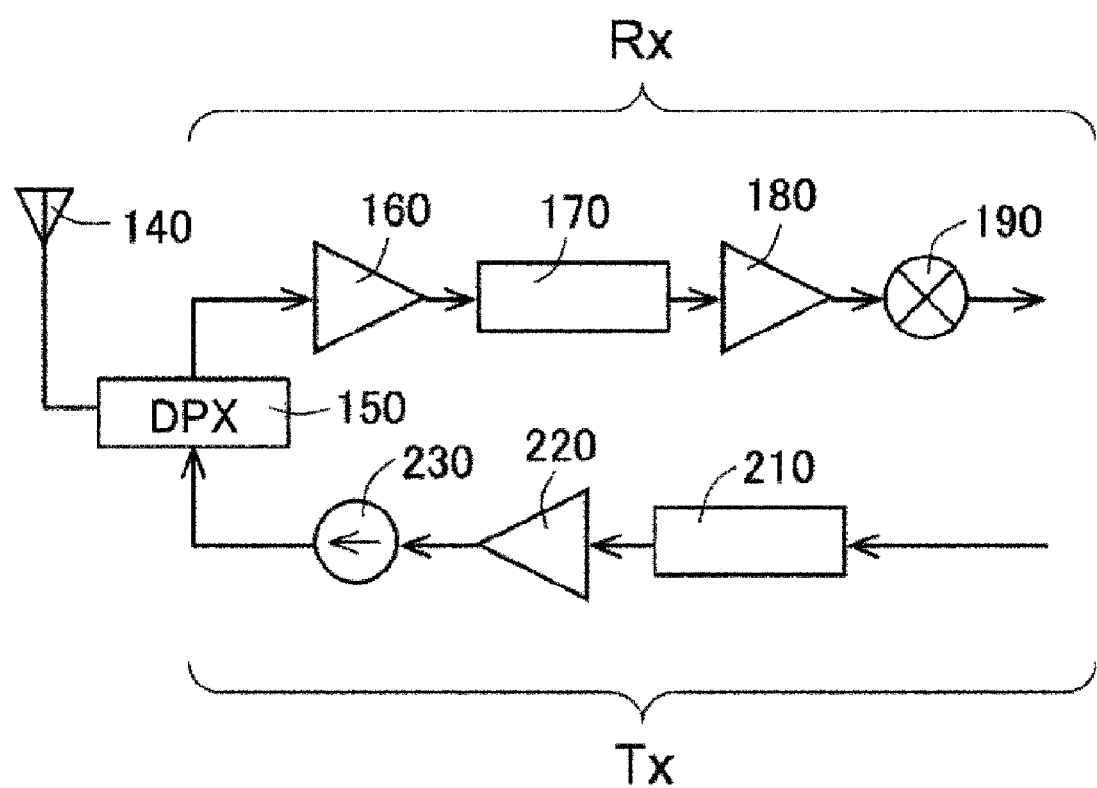
FIG. 25 is a block diagram showing a communication apparatus according to one embodiment of the present invention.

FIG. 25 is a block diagram showing a communication apparatus according to one embodiment of the present invention.

In FIG. 25, a transmitting circuit Tx and a receiving circuit Rx are connected to an antenna 140 via a splitter 150. A high frequency signal to be transmitted has its undesired signal removed with a filter 210, is amplified with a power amplifier 220, passes through an isolator 230 and the splitter 150, and is emitted from the antenna 140. A high frequency signal received at the antenna 140 passes through the splitter 150, is amplified with a low noise amplifier 160, has its undesired signal removed with a filter 170, and is re-amplified with an amplifier 180 to be converted to a low frequency signal.

The reliability can be enhanced when the filter device of the present invention is used as any of the splitter 150, the filter 170, and the filter 210 in FIG. 25.

In FIG. 25, a communication apparatus including a transmitting circuit Tx and a receiving circuit Rx is illustrated. Alternatively, the communication apparatus may include one of the transmitting circuit Tx and the receiving circuit Rx.

According to the communication apparatus of the present invention having such a structure and including the filter device of the present invention, a communication apparatus having high reliability can be provided.

The present invention is not limited to the above described embodiments. Various modifications and alterations may be made without departing from the scope of the present invention.

For example, the printed resistors may be formed inside or on the rear surface of the circuit substrate 41. Instead of the printed resistors, a $\lambda/4$ line or an inductor may be formed on the front surface, in the inner layer, or on the rear surface of the circuit substrate 41.

The connecting conductor 20 or one of the input/output terminals may have a function of the annular electrode layer 43.

In the capacitor device of the embodiment of the present invention shown in FIGS. 7 and 8, all the bias lines are formed at the circuit substrate 41 side. Alternatively, some of the bias lines may be formed at the circuit substrate 41 side and some may be formed on the supporting substrate.

The input/output terminals of the examples described above are extended to the lower surface of the circuit substrate 41. Alternatively, the input/output terminals may be connected to an external circuit through the upper surface.

Examples in which the first capacitor element 6 and the second capacitor element 7 are connected in series are described above but they may be connected in parallel. For example, in FIG. 16A, the wiring pattern for the input/output terminals may be connected to the reference potential and the input terminal for the high frequency signals may be connected to a wiring pattern that electrically interconnect the first capacitor element 6 and the second capacitor element 7 so that the first capacitor element 6 an the second capacitor element 7 are connected to each other in parallel.

The present invention can be implemented in various forms without departing from its spirit or main features. Thus, the embodiments described above are in every aspect merely examples. The scope of the present invention is to be defined by the claims only and the specification should not be regarded as restrictive. Every modification and alteration within the scope of the claims fall within the scope of the present invention.

The invention claimed is:

1. A capacitor device, comprising:
    a supporting substrate;
    a capacitor element comprising a dielectric layer containing an oxide and a pair of electrodes sandwiching the dielectric layer therebetween, the capacitor element being disposed on the supporting substrate; and
    a sealant sealing the capacitor element through a space, wherein the dielectric layer comprises an exposed part exposed in the space, and gas containing oxygen is in the space.

2. The capacitor device according to claim 1, wherein the dielectric layer contains a perovskite-type oxide containing at least Ba, Sr, and Ti.

3. The capacitor device according to claim 1, wherein dry air is in the space.

4. The capacitor device according to claim 1, wherein the sealant is a cap-shaped cap member which covers the supporting substrate.

5. The capacitor device according to claim 1, further comprising:
    a terminal portion electrically connected to at least one of the pair of electrodes of the capacitor element; and
    a circuit substrate comprising a pad portion at a position corresponding to the terminal portion to electrically connect the terminal portion and the pad portion to each other, wherein the sealant comprises:
        the circuit substrate, and
        an annular member surrounding a region where the capacitor element is disposed and joining the circuit substrate to the supporting substrate to seal the capacitor element.

6. The capacitor device according to claim 5, wherein the terminal portion comprises a first terminal connected to one of the pair of electrodes and a second terminal connected to the other of the pair of the electrodes, and the first terminal surrounds the second terminal and the region where the capacitor element is disposed and functions as the annular member.

7. The capacitor device according to claim 5, wherein at least one of the pair of electrodes is electrically connected to the terminal portion via a metal wire.

8. The capacitor device according to claim 4, further comprising:
    a first columnar electrode electrically connected to one of the pair of electrodes and comprising an end surface exposed from an upper portion of the cap member; and
    a second columnar electrode electrically connected to the other of the pair of electrodes and comprising an end surface exposed from the upper portion of the cap member.

9. The capacitor device according to claim 1, wherein the capacitor element includes a plurality of capacitor elements, wherein the plurality of capacitor elements comprise a first capacitor element and a second capacitor element connected to the first capacitor element via a metal wire.

10. The capacitor device according to claim 1, wherein a dielectric constant of the dielectric layer changes in response to application of voltage, and the capacitor device further comprises a bias line for applying voltage to the capacitor element.

11. A capacitor device comprising:
    a capacitor comprising:
        a supporting substrate;
        a capacitor element group comprising a plurality of capacitor elements including a first capacitor element and a second capacitor element, each capacitor element comprising a lower electrode, a dielectric layer containing an oxide, and an upper electrode sequentially stacked on the supporting substrate in the thickness direction;
        a first connector connected to an electrode of the first capacitor element to electrically connect the first capacitor element to an external circuit; and
        a second connector connected to an electrode of the second capacitor element to electrically connect the second capacitor element to the external circuit,
        wherein the first connector and the second connector are connected to the external circuit to electrically connect the first capacitor element to the second capacitor element;
    a circuit substrate onto which the capacitor is mounted, the circuit substrate comprising a conductor, the first connector and the second connector electrically connecting the first capacitor element to the second capacitor element via the conductor; and
    a sealant sealing the capacitor element group through a space, wherein the dielectric layer comprises an exposed part exposed to the space, and gas containing oxygen is in the space.

12. The capacitor device according to claim 11, wherein dry air is in the space.

13. The capacitor device according to claim 11, wherein the sealant comprises an annular member which surrounds the region where the capacitor element group is disposed and joins the circuit substrate to the supporting substrate to seal the capacitor elements.

14. The capacitor device according to claim 11, wherein the sealant comprises a resin member which covers throughout a main surface of the circuit substrate to which the capacitor is connected, side surfaces of the supporting substrate, and a main surface of the supporting substrate not facing the circuit substrate.

15. The capacitor device according to claim 14, wherein the resin member is a sheet-shaped resin member.

16. The capacitor device according to claim 11, wherein a dielectric constant of the dielectric layer changes in response to application of voltage, and the circuit substrate comprises a bias line for applying voltage to the first capacitor element and the second capacitor element.

17. The capacitor device according to claim 11, wherein the first capacitor element and the second capacitor element are connected in series.

18. The capacitor device according to claim 11, wherein the capacitor device is a component of an electronic component for a resonant circuit.

19. The capacitor device according to claim 18, wherein the capacitor device is a component of a filter device further comprising:
    an input terminal,
    an output terminal, and
    a reference potential terminal, wherein the electronic component is provided at a point on an input/output line connecting the input terminal to the output terminal or at a point between the input/output line and the reference potential terminal.

20. The capacitor device according to claim 19, wherein the capacitor device is a component of a communication apparatus further comprising at least one of a receiving circuit and a transmitting circuit.

21. A method of manufacturing a capacitor device, comprising:

forming a capacitor element on a supporting substrate, the capacitor element comprising a dielectric layer containing an oxide and a pair of electrodes sandwiching the dielectric layer; and sealing the capacitor element with a sealant through a space in an atmosphere containing oxygen, the capacitor element being sealed with the sealant so as to expose part of the dielectric layer in the space with the space containing oxygen.

* * * * *